(12) United States Patent
Kroneberger

(10) Patent No.: US 11,807,935 B2
(45) Date of Patent: Nov. 7, 2023

(54) CRUCIBLE COVER FOR COATING WITH AN ELECTRON BEAM SOURCE

(71) Applicant: Ferrotec (USA) Corporation, Santa Clara, CA (US)

(72) Inventor: Cris Kroneberger, Livermore, CA (US)

(73) Assignee: FERROTEC (USA) CORPORATION, Santa Clara, CA (US)

(*) Notice: Subject to any disclaimer, the term of this patent is extended or adjusted under 35 U.S.C. 154(b) by 276 days.

(21) Appl. No.: 17/295,083

(22) PCT Filed: Nov. 30, 2018

(86) PCT No.: PCT/US2018/063180
§ 371 (c)(1),
(2) Date: May 19, 2021

(87) PCT Pub. No.: WO2020/112125
PCT Pub. Date: Jun. 4, 2020

(65) Prior Publication Data
US 2022/0018013 A1    Jan. 20, 2022

(51) Int. Cl.
*C23C 14/24*    (2006.01)
*C23C 14/30*    (2006.01)

(52) U.S. Cl.
CPC .......... *C23C 14/243* (2013.01); *C23C 14/30* (2013.01)

(58) Field of Classification Search
CPC .................................................. C23C 14/243
See application file for complete search history.

(56) References Cited

U.S. PATENT DOCUMENTS 4,303,615 A * 12/1981 Jarmell ............... G01N 33/222
                                                        422/78
4,748,935 A    6/1988 Wegmann
(Continued)

FOREIGN PATENT DOCUMENTS

CN         202688419 U       1/2013
EP          0345015 A1      12/1989
(Continued)

OTHER PUBLICATIONS

PCT International Search Report for PCT/US2018/063180, dated Aug. 19, 2019.
(Continued)

*Primary Examiner* — Keath T Chen
(74) *Attorney, Agent, or Firm* — Hayes Soloway PC

(57) ABSTRACT

A cover arrangement comprised of at least two pieces for covering a crucible within an electron beam source assembly. The cover includes a cover body and a cover insert to be separate from and carried by the cover body, when the cover body is raised and lowered. This arrangement also allows the cover insert to be lowered until it comes to rest on top of the crucible. Upon contact between the cover insert and the crucible, the cover insert can partially decouple from the cover body, allowing the cover body to travel down slightly further, allowing it to come into contact with the water-cooled body that surrounds the crucible, while insuring that the crucible insert is in good contact with the crucible. Closing this gap helps stop material that is evaporating from the active crucible pocket from migrating to inactive pockets, located under the cover, during the evaporation process.

23 Claims, 18 Drawing Sheets

(56) References Cited

U.S. PATENT DOCUMENTS

| | | | |
|---|---|---|---|
| 4,944,245 A | 7/1990 | Stoessl et al. | |
| 4,983,806 A | 1/1991 | Harper et al. | |
| 5,480,678 A * | 1/1996 | Rudolph | C23C 16/045 |
| | | | 118/724 |
| 6,012,413 A | 1/2000 | Tsujimoto et al. | |
| 6,902,625 B2 | 6/2005 | Ramsay | |
| 2016/0258052 A1 * | 9/2016 | Wang | C23C 14/24 |

FOREIGN PATENT DOCUMENTS

| | | |
|---|---|---|
| EP | 1160351 A2 | 5/2001 |
| JP | 2002038256 A | 2/2002 |
| JP | 2002097566 A | 4/2002 |
| JP | 2012229462 A | 11/2012 |
| WO | 2014006706 A1 | 6/2016 |

OTHER PUBLICATIONS

PCT Written Opinion of the International Searching Authority for PCT/US2018/063180, dated Aug. 19, 2019.

\* cited by examiner

Prior Art - Fig. 1

CRUCIBLE COVER FOR COATING WITH AN ELECTRON BEAM SOURCE

BACKGROUND OF THE INVENTION

1. Field of the Invention

The present invention relates generally to crucible covers for multiple pocket electron beam sources used in vacuum coating systems. Particularly, the present invention relates to crucible covers in which individual crucible pockets containing coating materials are heated to produce coating vapors. More particularly, the present invention relates to cooperating cover and crucible combinations that isolate heated pockets from all other pockets.

2. Description of the Prior Art

Vacuum coating or deposition of materials is a process commonly used in the manufacture of a variety of products including, but not limited to, semiconductors, optics, and the formation of thermal barriers on high temperature components. One method for coating materials having very small vapor pressures, such as metals or ceramics, is by placing the coating material and a workpiece to be coated in a vacuum chamber, reducing the pressure (typically in the range of $10^{-7}$ to $10^{-4}$ Torr), and heating the material. The resulting coating vapor streams outwards from the material and coats the surface of the workpiece. Due to the low vacuum chamber pressure, vaporized coating materials travel nearly unimpeded, following an approximately line-of-sight trajectory. The most common sample heating method uses directed electron beam energy.

Many manufacturing steps involve depositing multilayered coatings of a multitude of materials. Generally, it is important to be able to control the coating purity and deposition thickness to achieve desired results. In addition, many of the benefits of producing multiple coating layers on a workpiece are achieved when the coating steps are carried out sequentially under vacuum. The trend in coating technology has been towards obtaining purer, more uniform and controllable coating thickness of multiple materials. An apparatus for carrying out sequential coating describes a mechanism for sequentially moving crucible pockets in line with a single heating source in a single vacuum chamber. While the mechanism of that apparatus was used in conjunction with electric resistance heating, the same mechanism works just as well with other sources, such as electron beams. The use of electron beams, which can be positioned using controllable magnetic fields, allows for the option of keeping the samples in place while deflecting the heating source.

A major problem is cross-contamination between crucibles. Within this multi pocket source assembly, one pocket is considered to be the active pocket at any given time. This active pocket is exposed so the electron beam from an emitter assembly can be directed to this pocket. The intent is to heat up, melt and evaporate a volume of material that is placed within this active pocket. The remaining inactive pockets are located under the cover. The cover acts as a shield that partially isolates these inactive pockets from stray material that is evaporated from the active pocket.

The cover of the electron beam source assembly in the current art is either integrated into the top body of the electron beam source assembly, fastened to the top of the electron beam source assembly, suspended from a separate structure, or mounted to a movable structure. In the case of the movable structure, the cover is allowed to move up and down or tilt up and down above the crucible. This motion increases and decreases the clearance between the cover and the crucible. This motion allows for a greater clearance between the cover and crucible during crucible rotation and a smaller clearance during material evaporation. This motion may also allow a stepped portion of the cover to extend down past the uppermost surface of the crucible, when the cover is moved into its lowest position. Notwithstanding that the majority of coating materials is directed away from its source, some material invariably diffuses back towards the source and contaminating the other source materials. This reduces the purity of the coating material and limits the usefulness of multiple coating pockets.

One solution to the contamination problem is to incorporate a non-contacting crucible cover or movable lid with an opening that allows vapor from the heated sample to coat the workpiece, while shielding all of the other samples contamination. A typical cover arrangement is shown in U.S. Pat. No. 4,748,935 to Wegmann, which discloses an electron beam heated vapor source with such a cover. The arrangement is that of a flat, fixed cover and a multiple pocket crucible that rotates the samples through a heating region, allowing each pocket in turn to become a heated pocket. The cover and crucible are separated by a small gap that limits, but does not eliminate, line-of-sight contamination. In this configuration, coating deposits that build up on the lid interfere with the desired operation of the cover and require a substantial amount of maintenance. In addition, this type of cover can result in a new path for contamination. Cover deposits can be scraped off or flake off into crucibles containing different materials. Nearly all covers known in the art rely on close tolerances to reduce, but not eliminate, line-of-sight contamination. Unfortunately, they still have the disadvantage of providing a path for contamination.

Some of the limitations of noncontacting covers were addressed in U.S. Pat. No. 4,944,245 to Stoessl et al. In Stoessl et al., a cover contacts the crucible surface in the vicinity of the heated sample to hinder the flow of material from the heated sample to any unheated samples. The cover and crucible are connected so that crucible rotation lifts the cover, allowing for sample selection. Although this approach reduces contamination by vapors migrating from heated to unheated samples, it is well known by those in the art that coating material rapidly accumulates on cover and crucible surfaces located within line-of-sight and particularly on those surfaces that are also near heated samples. In addition, the lifting mechanism described by Stoessl et al. occupies a large fraction of the crucible surface area, limiting the number of samples which can be accommodated. The coupled rotation and lifting mechanism of Stoessl et al. also allows for multiple contacts per material selection if the rotation is not between adjacent crucibles, which may increase the opportunity for cross-contamination.

In both the Wegmann and Stoessl et al. configurations, deposits have a tendency to rapidly accumulate thick layers of coating material that can easily flake or be scraped off and contaminate adjoining samples during rotation of the crucible. In addition, the close tolerances between cover and crucible in both of those references can be violated by deposits, requiring equipment maintenance limited by the ability of the cover mechanism to operate properly.

An improvement in the configurations of Wegmann and Stoessl et al. was provided by the apparatus disclosed in U.S. Pat. No. 6,902,625 to Ramsay, which is incorporated in its entirety herein by reference. Ramsay discloses an evaporative source that can hold many different materials for coating while reducing contamination between materials. The Ramsay evaporative source relies on a non-contacting baffle arrangement that is unaffected by unwanted deposits to a much greater degree. FIGS. 1 and 2 illustrate the Ramsay evaporative source 10. A crucible 30 with six crucible pockets 32 is mounted inside of source housing 12.

The intersection of pockets 32 on the crucible surface 34 defines pocket edges 33 around each pocket. The crucible is mounted to the source such that it can rotate about the crucible axis of rotation 35. An electron beam source (not shown) located inside the evaporative source has an exit 40, from which an electron beam 42 emanates. The beam is directed from the exit to the material heating location 35 by magnets, also located inside the source (also not shown). The deflection of electron beams for evaporative heating, as well as sweeping the beam for controllable heating is well known in the art. A crucible lid or cover 20 is positioned over the pockets has a cover opening 22 formed by protrusion or lip 24. Rotation of crucible 30 allows for any one of the pockets to be open at a time. The uncovered pocket is aligned with heating location 35. Location 35 is fixed relative to electron beam 42, while each of crucible pockets 32 can be positioned near location 35 for sweepable heating of the exposed material.

Details are shown in the exploded perspective view of FIG. 2, in which the cover is removed from the source. Each of crucible pockets 32 has a trough, recess or groove 36 located on crucible surface 34 that is located between each pocket and all of the other pockets. The three-dimensional shape of groove 36 matches that of lip 24 in the vicinity of the heated pocket, in matching pairs, that produces an interlocking, noncontacting baffle.

SUMMARY OF THE INVENTION

The prior art solution to reducing cross-contamination between pockets in multiple pocket sources relied on either closely spaced flat covers or covers that sealed with the crucible. Those solutions rely on maintaining close tolerances in regions where tolerances are difficult to maintain due to rapid build up of unwanted deposits.

The present invention circumvents the problems in the prior art systems by relying on a two-part crucible cover that contacts the crucible surface but that is easily maintained when unwanted deposits on the cover accumulate.

The present invention is a cover arrangement that is comprised of at least two pieces for covering a crucible within an electron beam source assembly. This arrangement allows a sealing portion (a cover insert) to be separate from and carried by a cover body, when the cover body is raised and lowered. This arrangement also allows the cover insert to be lowered until it comes to rest on top of the crucible. This significantly reduces or eliminates the gap between the crucible and cover. Upon contact between the cover insert and the crucible, the cover insert can partially decouple from the cover body, allowing the cover body to travel down slightly further, allowing it to come into contact with the water-cooled body that surrounds the crucible, while insuring that the crucible insert is in good contact with the crucible. Closing this gap helps stop material that is evaporating from the active crucible pocket from migrating to inactive pockets, located under the cover, during the evaporation process.

The present invention achieves these and other objectives by providing crucible cover having a cover body and a cover insert for a multiple pocket vapor source that produces vapor by an electron beam directed to uncovered crucible pockets. The cover body has a covering surface, a cover opening and a cover opening edge along the cover opening. The covering surface faces a crucible having a crucible surface with a plurality of pockets formed therein for holding coating materials to be evaporated. The pockets are covered or uncovered by automatically lifting the crucible cover, rotating the crucible and lowering the crucible cover to thereby align one of the plurality of pockets with the cover opening. The cover insert has an insert bottom surface and an open area that coincides with the cover opening where the cover insert is removably coupled to the cover body where the insert bottom surface extends below the covering surface and where the cover insert is connected along an edge of the cover opening. The cover insert only lines the edge of the cover opening and does not block the cover opening. The cover insert becomes partially decoupled from the cover body when the cover body is relative to the crucible and the cover insert contacts the crucible.

In another embodiment, the cover insert has features isolating each pocket from an adjacent pocket by contact between the cover insert and the crucible including isolating the uncovered pocket from the covered pockets such that contamination from heated vapors is minimized and deposition on the cover insert and crucible does not result in cross-contamination between pockets.

In another embodiment, the cover insert has an insert body that is V-shaped with an inside edge, an outside edge and a top surface.

In another embodiment, the cooperating surface features include a crucible barrier extending from the perimeter of the crucible pockets towards the cover insert and a matching protrusion on the cover insert surface towards the crucible barrier.

In still another embodiment, the cooperating surface features include at least one recess on the crucible surface and a matching protrusion on the cover insert.

In yet another embodiment, the cooperating surface nearest the covered pocket is comprised of a groove on the crucible surface and a matching protrusion on the cover insert.

In still another embodiment, the cover insert has an insert body that is V-shaped with an inside edge, an outside edge and a top surface.

In one embodiment, the top surface is tapered in thickness from the outside edge to the inside edge.

In one embodiment, the insert bottom surface of the cover insert has raised bottom portions having an insert bottom contact surface wherein the insert bottom contact surface is recessed a predefined distance from the inside edge.

In one embodiment, the insert bottom surface of the cover insert is recessed back away from the outside surface forming a ledge.

In one embodiment, wherein the cover opening has a recess along the cover opening edge forming a cover body ledge that coincides with the cover insert ledge to matingly couple and partially decouple with the cover insert.

In one embodiment, the covering surface of the cover body has structural features that are capable of mating contact with corresponding structural features of the crucible further isolating each pocket from an adjacent pocket by contact between the covering surface and the crucible including isolating the uncovered pocket from the covered pockets.

In another embodiment, a covered, multiple pocket vapor source assembly where vapor is produced by an electron beam that can be directed to uncovered crucible pockets is disclosed. The assembly includes a housing, a crucible rotatably mounted within the housing, a plurality of pockets in the crucible, a cover having a cover body with a covering surface and a cover opening where the covering surface faces the crucible, and a cover insert having an insert bottom surface and an open area that coincides with the cover opening where the cover insert is removably coupled to the cover opening where the insert bottom surface extends below the covering surface bottom such that the cover insert does not block the cover opening. The cover insert becomes partially decoupled from the cover body when the cover body is lowered relative to the crucible and the cover insert contacts the crucible, and matching pairs of cooperating surfaces on the cover insert and a crucible surface between each pocket. The pockets are configured to hold coating materials and the crucible is rotatable to bring any of the pockets into a position to receive energy from the electron beam.

In another embodiment, a crucible covering system for a multiple pocket source is disclosed. The system includes a crucible having an axis and a plurality of pockets to hold material to be evaporated where the crucible has a crucible surface between each pocket, a cover that extends along a plane perpendicular to the axis to cover all but a selected at least one of the plurality of pockets, and matching pairs of cooperating surfaces on the cover insert and the crucible surface between each pocket. The cover has a cover body with a cover opening to expose one pocket of the plurality of pockets, and a cover insert with an insert bottom surface and an open area that coincides with the cover opening where the cover insert removably coupled to the cover body along a cover opening edge where the insert bottom surface extends below the covering surface. The cover insert becomes partially decoupled from the cover body when the cover body is lowered relative to the crucible and the cover insert contacts the crucible.

One advantage of the present invention is that the cover insert rests on, in, or around features of the cover body, so it can partially decouple from the cover body and seek its own height and levelness, when the cover body is lowered sufficiently. Alternatively, the cover insert can be partially secured to the cover body by means of a spring like element or elements which can provide additional downward force to the cover insert, thus increasing the force against the crucible.

Another advantage of the present invention is that when the cover body is lowered, the cover insert will also be lowered until the insert comes into contact with the crucible. At that point, the cover insert will stop its downward motion and remain in contact with the crucible, while the cover body continued its downward travel to its resting point. It is noted that the drawings illustrate the cover insert contacting a raised wall (dividing web structure) of the crucible that is located at an elevation above the crucible surface. This cover insert concept will work in other configurations as well, such as having the cover insert coming to rest on a surface near horizontal to the crucible surface, or a surface which is lower than the crucible surface, if the web structure is sufficiently short or not present.

A further advantage of the present invention is that the partial decoupling between the cover body and the cover insert reduces the need to set precise clearances and parallelisms between the cover and crucible in order to minimize or eliminate the gap between them. This is accomplished by design so that the cover body has sufficient over travel to insure that the cover insert comes into contact with the crucible at a wide range of dimensional variation during setup of the source assembly. This will also allow easier reassembly after servicing the source assembly.

Another advantage of the present invention is that the cover is in contact with the area of the crucible that separates the active pocket form the inactive pocket. This contact isolates and protects the inactive pockets from evaporant emanating from the active pocket. This is accomplished by closing the cover/crucible gap that would otherwise exist between the active and inactive pockets. This prevents contamination of material in an inactive pocket from that of the active pocket.

Still another advantage of the present invention is that the cover insert can be easily removed for cleaning and replacement. Material that is evaporated from the active pocket will tend to build up over time on the portion of the cover that is in close proximity to the active pocket. At some point in time, either the buildup will need to be mechanically removed or the cover would need to be replaced. In the present invention, the cover insert will receive this buildup while the cover body remains relatively free of coating buildup. This allows the cleaning process to be accomplished in a shorter period of time and/or the cover insert can be replaced for shorter down time. The used cover insert can then be cleaned with other cover inserts as a group thereby taking advantage of economies of scale.

Yet another advantage of the present invention is that the cover insert can be made out of a material different from that of the cover body, if desired. This would allow the insert to be more wear resistant, and warp resistant. Conversely, the cover body can be made out of a material with higher thermal conductivity, such as copper, for better cooling. Even though the cover body is made out of a softer material, it will attain a greater service life since it is not being directly coated from the active pocket, thus not needing frequent cleaning.

It is another advantage of the invention that improved reliability and length of time between servicing will reduce the amount of scrap material and reduce the cost of operating coating equipment.

A further advantage of the invention is that it is simple and inexpensive to manufacture and service and that it is easy to use.

DETAILED DESCRIPTION OF THE INVENTION

Figure 1:
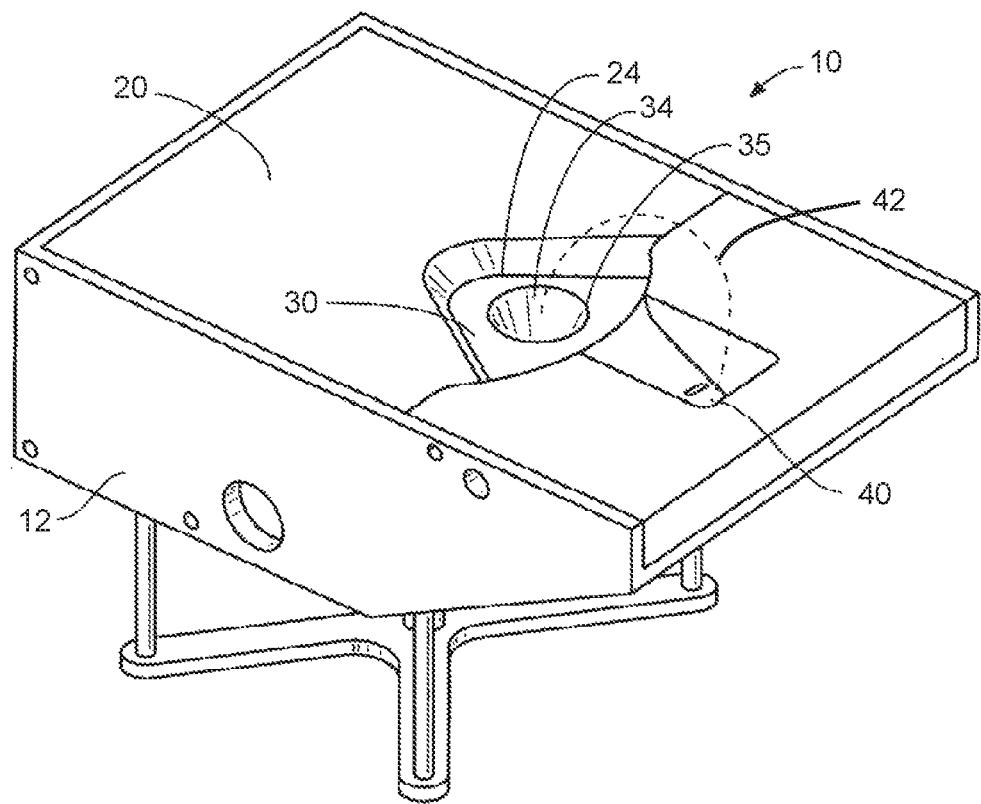
FIG. 1 is a perspective view of a prior art electron beam deposition system.
Figure 2:
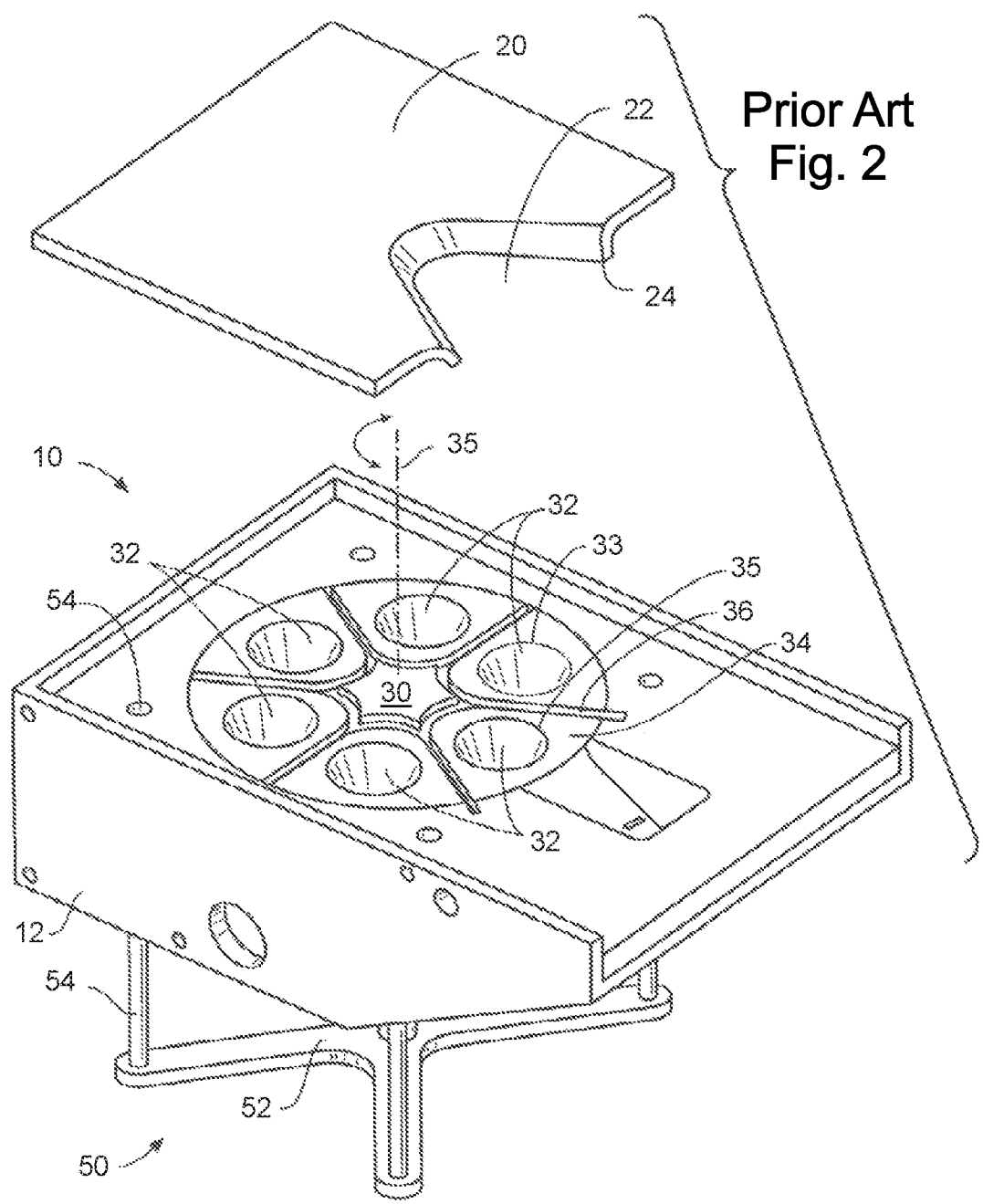
FIG. 2 is an exploded view of the prior art electron beam deposition system.
Figure 3:
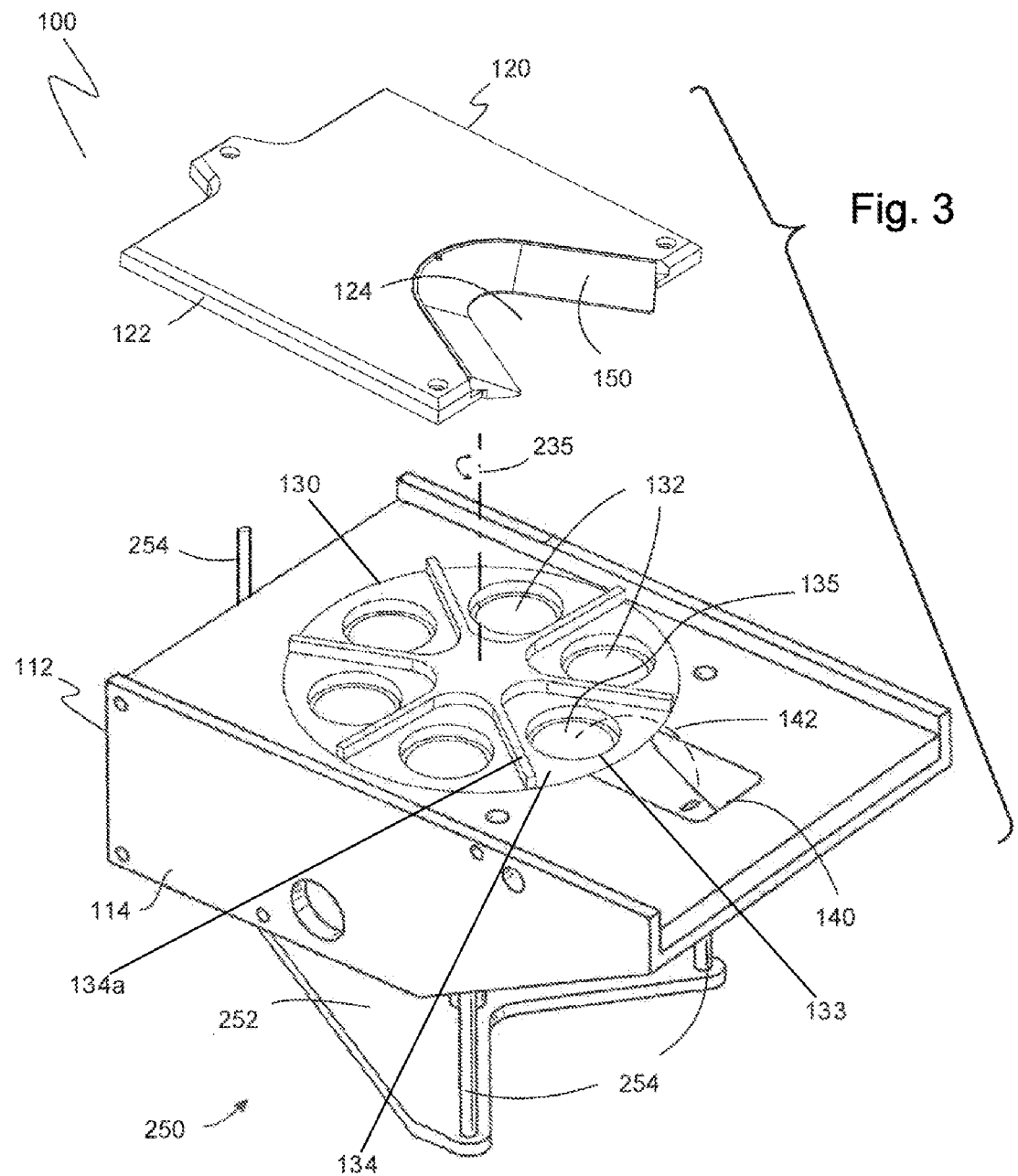
FIG. 3 is an exploded view of a first embodiment of the present invention showing an electron beam deposition system having a two-part crucible cover.
Figure 4:
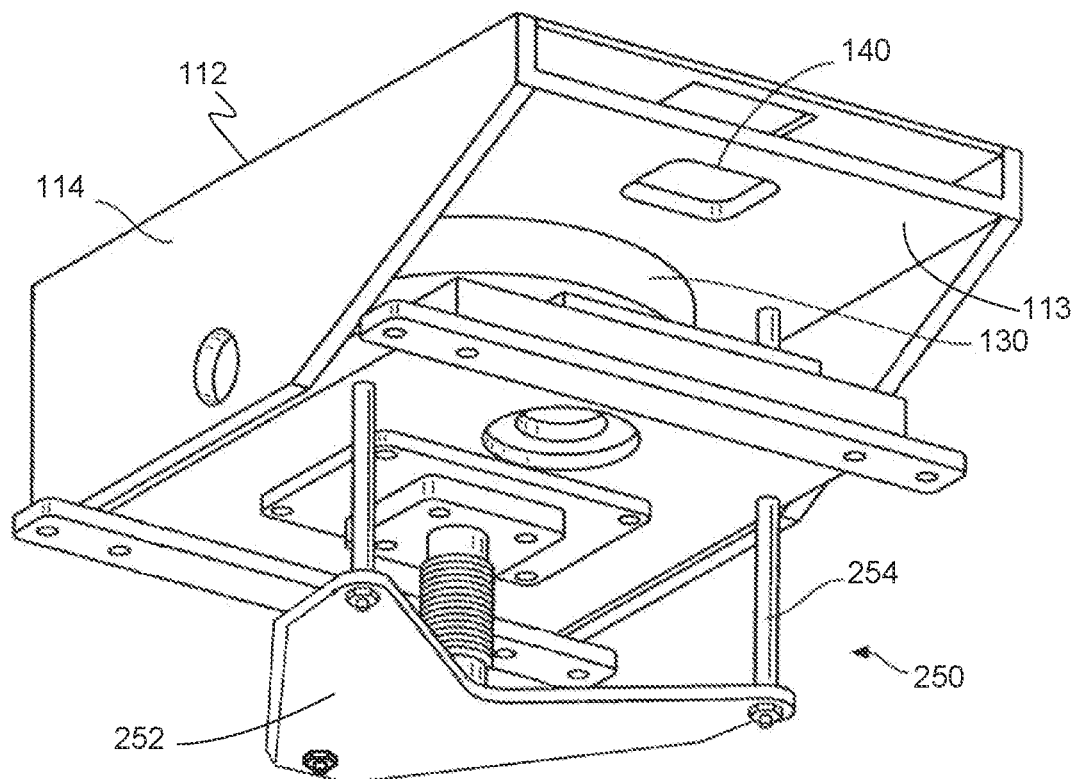
FIG. 4 is a perspective view of the bottom of the first and second embodiment of the invention showing the cover lifting mechanism.
Figure 5:
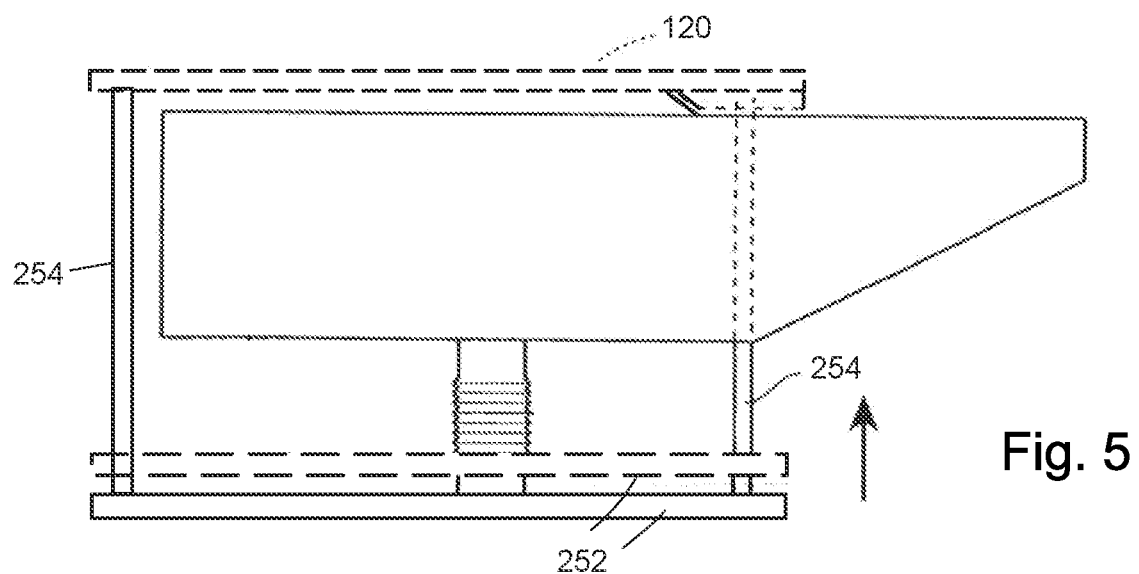
FIG. 5 is a side view of the first embodiment of the invention showing cover motion.

The present invention is illustrated in FIGS. 3-42. FIGS. 3-5 illustrate one embodiment of an evaporative source 100 of the present invention. A crucible 130 with six crucible pockets 132 is mounted inside of source housing 112. A variety of crucible materials and construction techniques are known to those skilled in the art, including but not limited to: crucibles with high thermal conductivity, low melting point materials, such as copper or aluminum, that incorporate water cooling; crucibles constructed out of high melting point materials such as graphite, tungsten, or molybdenum; and crucibles with graphite liners or those that use surface oxidation to limit thermal conductivity from the evaporant to the crucible surface.

The intersection of pockets 132 on the crucible surface 134 defines pocket edges 133 around each pocket. Crucible 130 may have more or fewer pockets, the choice of six pockets being for illustrative purposes only. The crucible is mounted to the source such that it can rotate about the crucible axis of rotation 235. An electron beam source (not shown) located inside the evaporative source 100 has an exit 140, from which an electron beam 142 emanates. The beam is directed from the exit to the material heating location 135 by magnets, also located inside the source (also not shown). The deflection of electron beams for evaporative heating, as well as sweeping the beam for controllable heating is well known in the art. Using such a deflection system, the heating location 135 comprises a finite area that is generally within the heated pocket edge. A crucible lid or cover 120 includes a cover body 122 and a cover insert 150. Cover 120 extends along a plane perpendicular to the axis to cover all but a selected at least one of the plurality of pockets 132 and is positioned over the pockets 132 and has a cover opening 124 formed by cover insert 150. Rotation of crucible 30 allows for any one of the pockets to be open at a time. The uncovered pocket is aligned with heating location 135 and is thus termed the "heated pocket," while all of the other pockets are termed "unheated pockets." Location 135 is fixed relative to electron beam 142, while each of crucible pockets 132 can be positioned near location 135 for sweepable heating of the exposed material. The area occupied by heating location 135 need not be larger than any one of pocket edges 133 to provide control of heating of the material in the pocket.

Each of crucible pockets 132 has a crucible surface portion 134a located on crucible surface 134 that is located between each pocket and all of the other pockets. Crucible surface portion 134a may be co-planar with crucible surface 134, may be a raised surface that is parallel to but above crucible surface 134, or may be a recessed surface that is parallel to but below crucible surface 134. The crucible surface portion 134a surrounding each pocket may either be isolated (not connected) to other crucible surface portions 134a, may be interconnected with the others and may be contained on crucible surface 134 or extend beyond the edge of crucible surface 134. Crucible surface portions 134a has features that match that of a bottom surface 160 of cover insert 150 in the vicinity of the heated pocket, in matching pairs, that produces aligned, contacting surfaces. Bottom surface 160 of cover insert 150 and crucible surface portions 134a thus situated cooperate to form a contact barrier, thereby blocking the line-of-sight between the heated and all of the unheated pockets. In other words, there are matching pairs of cooperating surfaces on the cover insert and the crucible surface between each pocket.

A rotation mechanism (not shown) for rotating crucible 130 allows selection from among multiple pockets 132, and a lifting mechanism 250 allows rotation without contact of cover 120 and crucible 130. The rotation mechanism couples crucible 130 to source housing 112 through a copper coil housing 113 located between magnet pole plates 114 of source housing 112 (as shown in FIG. 4), and can be controlled by external devices not shown to rotate crucible 130 about axis of rotation 235. By controlling the rotational position of crucible 130, any of pockets 132 can be brought into heating location 135. The rotation mechanism can consist of AC or DC motors or rotary or linear pneumatic actuators, and may also include sensors mounted on crucible 130 and housing 112 to detect rotational position. The lifting mechanism 250, including an actuator 252 and rods 254 that provide lifting motion to the cover 120. Also shown is crucible 130 and electron beam source exit 140. In one embodiment actuator 252 is a single action pneumatic actuator with a spring return enclosed in a bellows, with the spring forcing the cover into a normally up position. In another embodiment, actuator 252 is double acting, providing both raising and lower operations. Other lifting mechanism that could be used include, but are not limited to, lead screws, piezo-electric actuators, bimetallic elements, magnetic solenoid, and linear motors.

FIG. 4 shows a bottom view of the lifting mechanism 250 with a pair of rods 254 extending up through source housing 112 to contact cover 120 and a third rod 254 that is outside of source housing 112 and extends from actuator 252 directly to cover 120. The motion involved in lifting the cover is shown more clearly in the side view of FIG. 5. The solid and dashed cover lifting components (actuator 252, rods 254 and cover 120) shows the extreme points of motion. Cover 120 is connected at its corners closest to the electron beam source through rods 254 to actuator 252 and at a furthest point from the electron beam source on cover 120 through a third rod 254 connected to actuator 252. In the normally up, dashed position, bottom surface 152 of cover insert 150 clears the obstructing crucible, and in the forced down, solid position, the cover insert 150 is fully engaged with the crucible surface 134 or crucible surface portions 134a. The combination of a rotational and lifting mechanism is generally useful for rotational crucibles providing a way of covering and uncovering multiple pockets.

Figure 6:
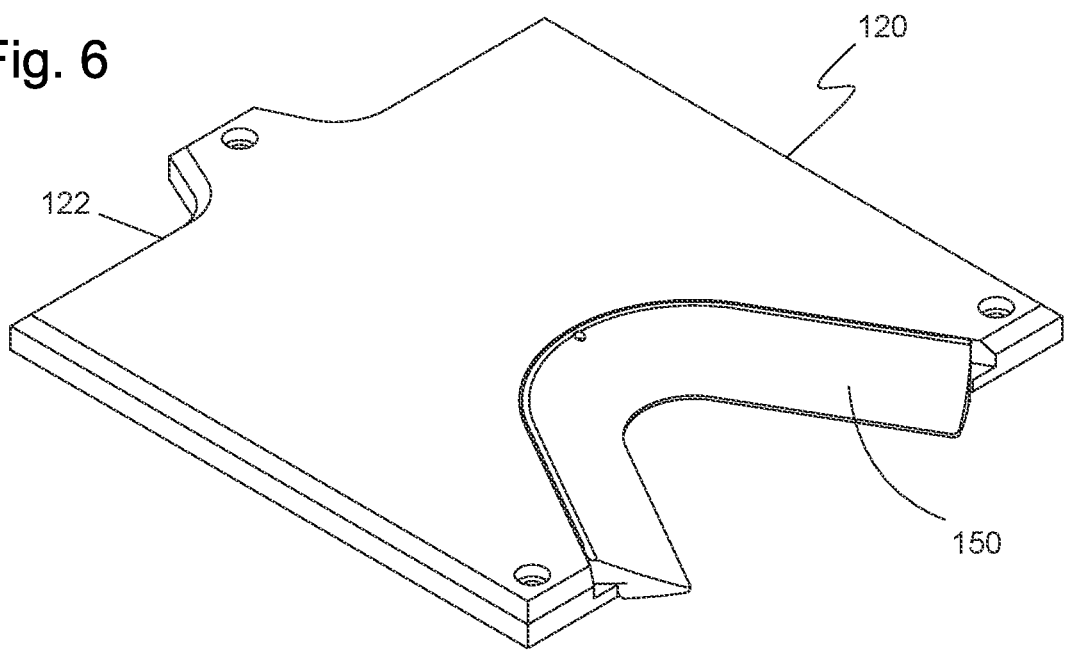
FIG. 6 is a right perspective view of a first embodiment of the invention showing a two-piece crucible cover with a cover body and a cover insert in an up position.
Figure 7:
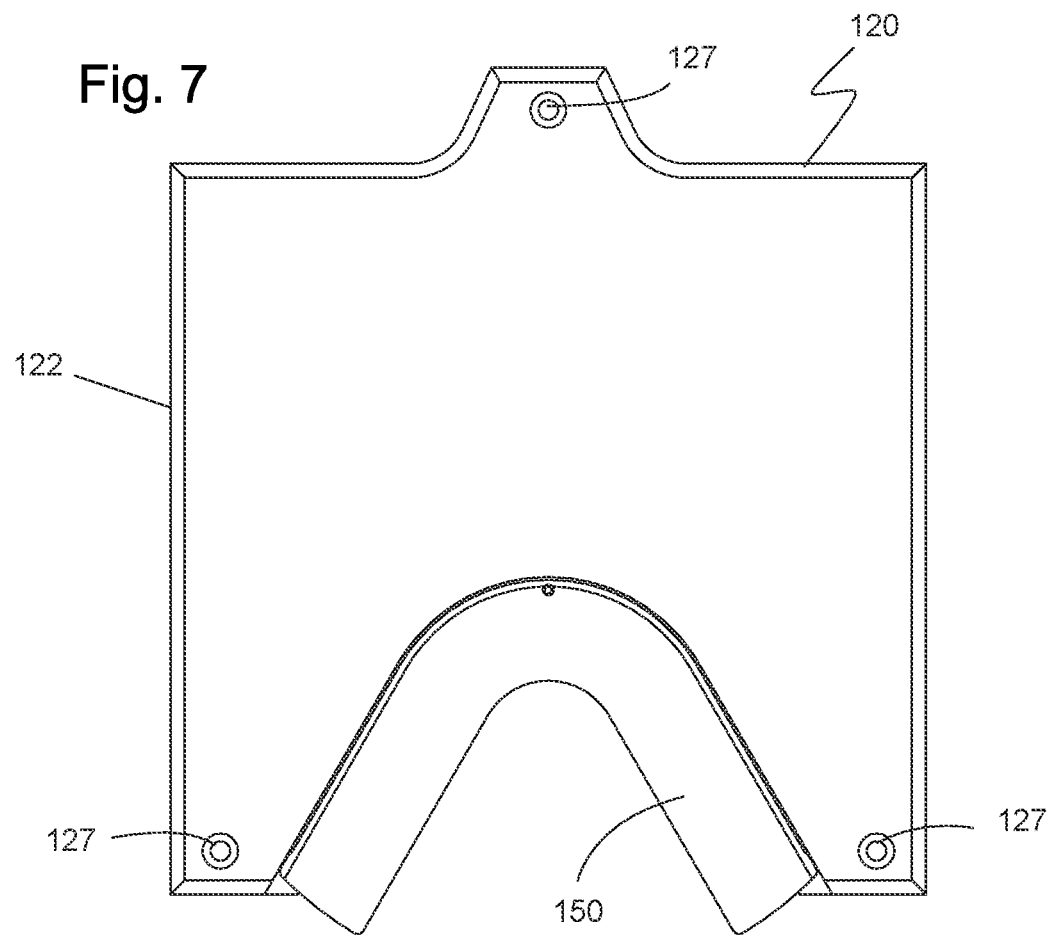
FIG. 7 is a top view of FIG. 6.

FIG. 6 is a perspective view of cover 120 in an up position meaning that cover insert 150 is in a down or coupled position relative to cover body 122. This position is attained when the lifting mechanism 250 raises cover 120 away from crucible 130. FIG. 7 is a top plan view of cover 120. In both FIGS. 6 and 7, there is illustrated the connecting locations 127 to which rods 254 are connected for lifting of cover 120.

Figure 8:
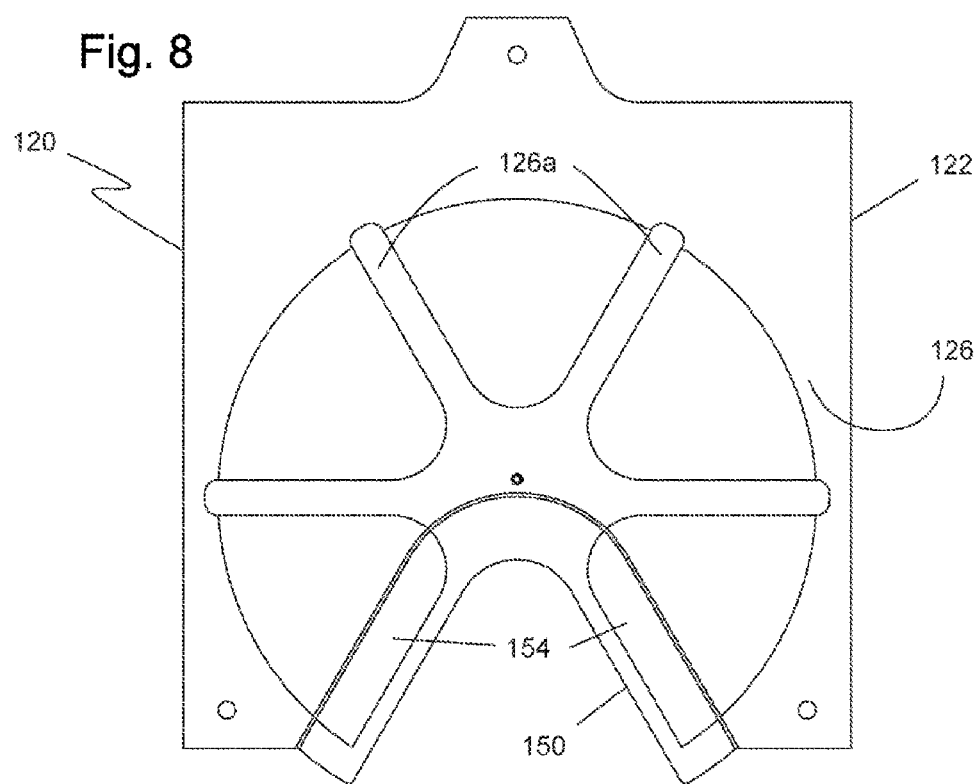
FIG. 8 is a bottom view of FIG. 6.
Figure 9:
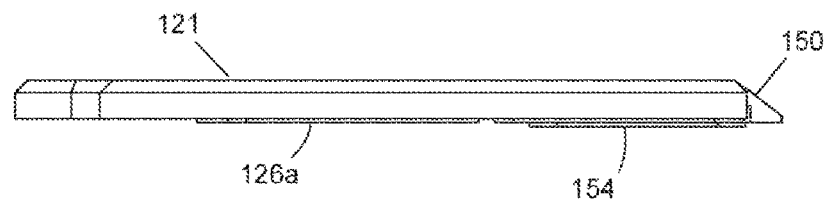
FIG. 9 is a right side plan view of FIG. 6.
Figure 10:
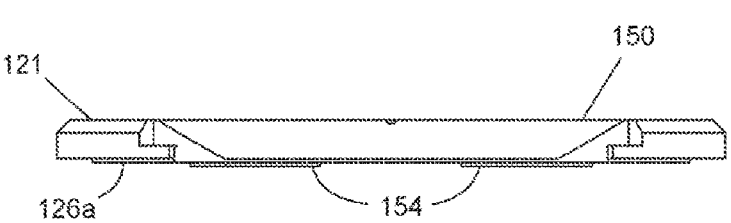
FIG. 10 is a front plan view of FIG. 6.

FIG. 8 is a bottom plan view of cover 120 of FIG. 7. Cover 120 has a bottom surface 126 and a plurality of bottom surfaces 126a that interact with crucible surface portions 134a of crucible 130 as well as copper coil housing 113. Cover insert 150 also includes insert bottom surfaces 154 that interact with crucible surface portions 134a. FIG. 9 is a side plan view of FIG. 6 showing cover 120 with cover insert 150. FIG. 10 is a front view of cover 120 shown in FIG. 6.

Figure 11:
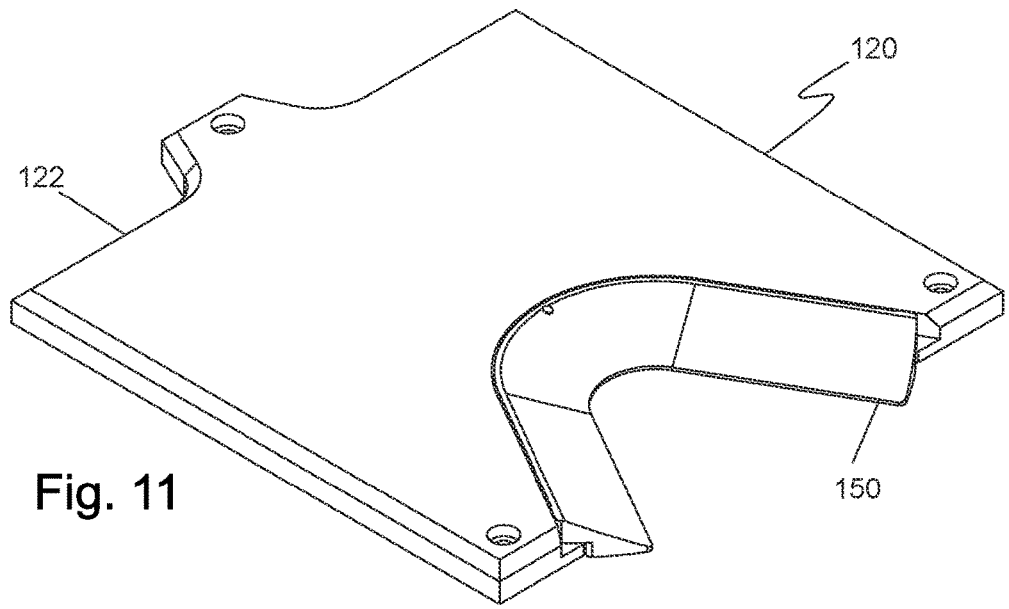
FIG. 11 is a right perspective view of the first embodiment of the invention showing the cover insert in a down position.
Figure 12:
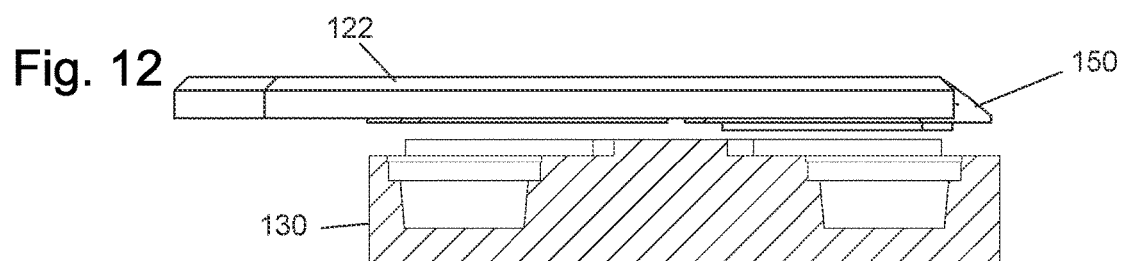
FIG. 12 is a right side plan view of FIG. 11 showing the cover in the up position relative to the crucible to allow crucible rotation.
Figure 13:
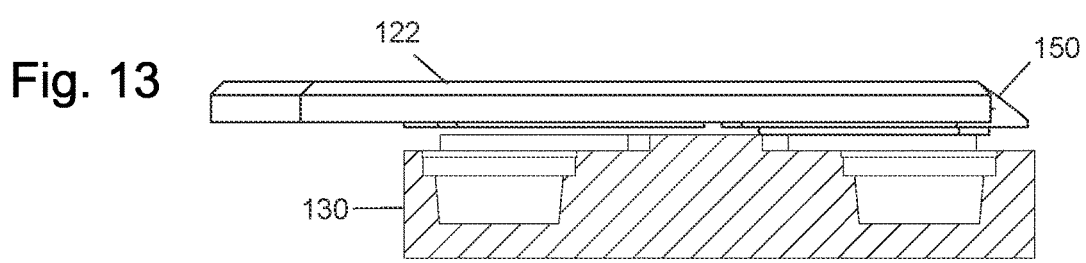
FIG. 13 is a right side, cross-sectional view of FIG. 6 showing the cover body and cover insert in a partially down position relative to the crucible with the cover body and cover insert still coupled where the cover insert is making initial contact with the crucible but the cover body is not in contact with the crucible.
Figure 14:
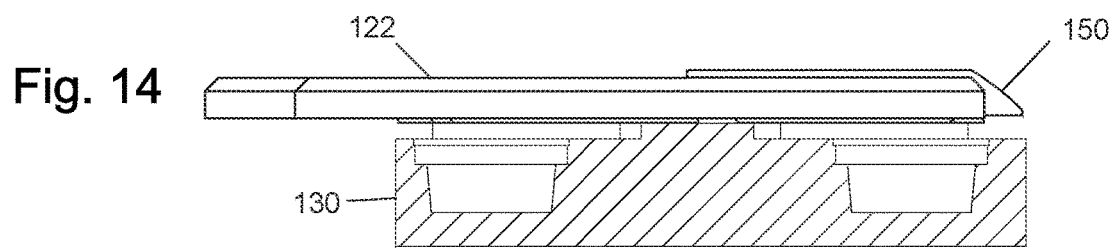
FIG. 14 is a right side, cross-sectional view of FIG. 11 showing the cover body decoupled from the cover insert where the cover body continues down to make contact with the copper coil housing and the cover insert remains in contact with the crucible.

FIG. 11 is a perspective view of cover 120 with cover insert 150 in a down position relative to cover body 122. This position is attained when the lifting mechanism 250 lifts cover 120 to an up position away from crucible 130 to allow rotation of crucible 130. FIG. 12 is a side, cross-sectional view of cover 120 in an up position relative to crucible 130. As shown, neither cover body 122 nor cover insert 150 contacts any portion of crucible 130. In this position, crucible 130 may be rotated to position one of the plurality of crucible pockets 132 to align with the cover opening 124. FIG. 13 is a side, cross-sectional view of cover 120 lowered toward crucible 130 where cover insert 150 just begins to make contact with crucible surface 134 or crucible surface portion 134a as the cover is being lowered by lifting mechanism 250. In FIG. 14, lifting mechanism continues to lower cover 120 until cover bottom surface 126 or bottom surface portions 126a contact with crucible surface 134 or crucible surface portion 134a and/or cover bottom surface 126 contacts copper coil housing 113. As can be seen between FIGS. 13 and 14, the movement of cover body 122 caused by cover body 122 being lowered to contact crucible surface 134 causes cover insert 150 to make contact with crucible surface 134 and stop its downward movement while cover body 122 continues its descent. FIGS. 13 and 14 show how cover insert 150 moves relative to cover body 122 such that cover insert 150 partially decouples from cover body 122 and seeks its own height and levelness when cover body 122 is lowered sufficiently.

Figure 15:
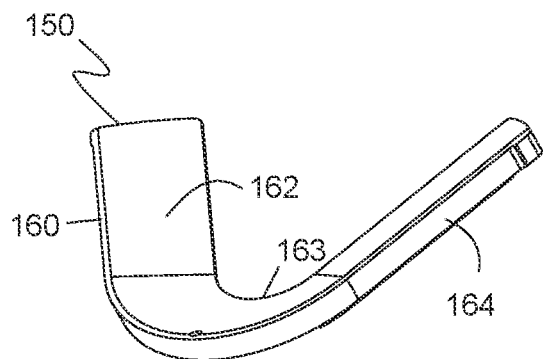
FIG. 15 is a top perspective view of the cover insert of FIG. 6.
Figure 16:
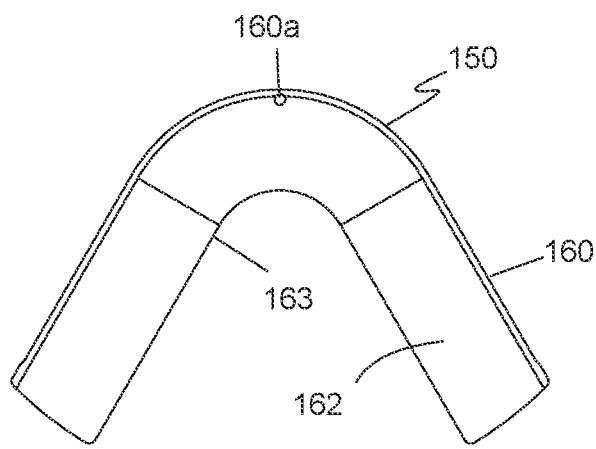
FIG. 16 is a top plan view of FIG. 15.
Figure 17:
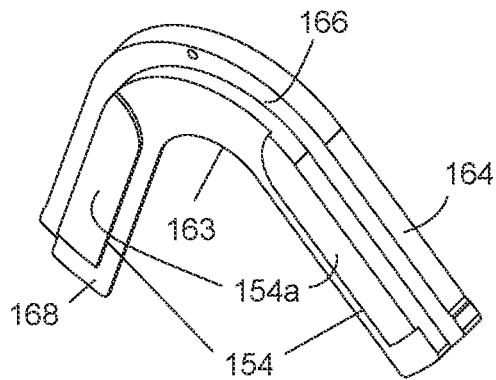
FIG. 17 is a bottom perspective view of the cover insert of FIG. 6.
Figure 18:
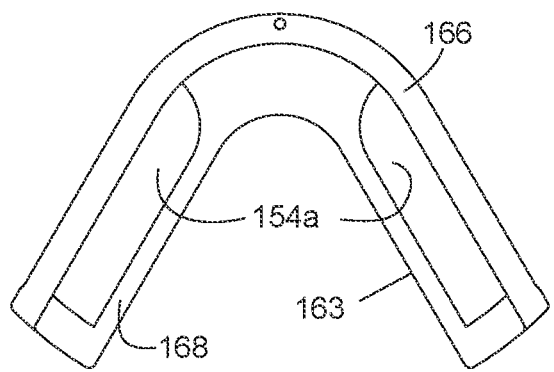
FIG. 18 is a bottom plan view of FIG. 17.

Turning now to FIGS. 15 to 18, there is illustrated various view of cover insert 150 showing structural features that isolate each pocket from and adjacent pocket by contact between the cover insert and the crucible including isolating the uncovered pocket from the covered pockets. FIG. 15 is a top perspective view showing insert body 160 having a V-shape with an inside edge 163, an outside edge 164. And a top surface 162. In one embodiment top surface 162 is tapered in thickness from outside edge 164 to inside edge 163 such that outside edge 164 is thicker than inside edge 163. FIG. 16 is a top view of cover insert 150. FIG. 17 is a bottom perspective view of insert body 160. Insert body 160 has an insert bottom surface 168 that is recessed back away from outside side edge 164 forming a ledge 166. Bottom portion 168 extends along the V-shape over the entire length of insert body 160. Insert bottom surface 168 further includes raised bottom portions 154 that extend along a portion of the arms of the V-shape to provide an insert bottom contact surface 154a that is recessed a predefined distance from tapered edge 163 exposing a portion of non-contact surface of bottom portion 168. Insert bottom contact surface 154a contacts crucible surface 134 or crucible surface portions 134a when cover 120 is lowered sufficiently to contact crucible 130. FIG. 18 is a bottom view of cover insert 150.

Figure 19:
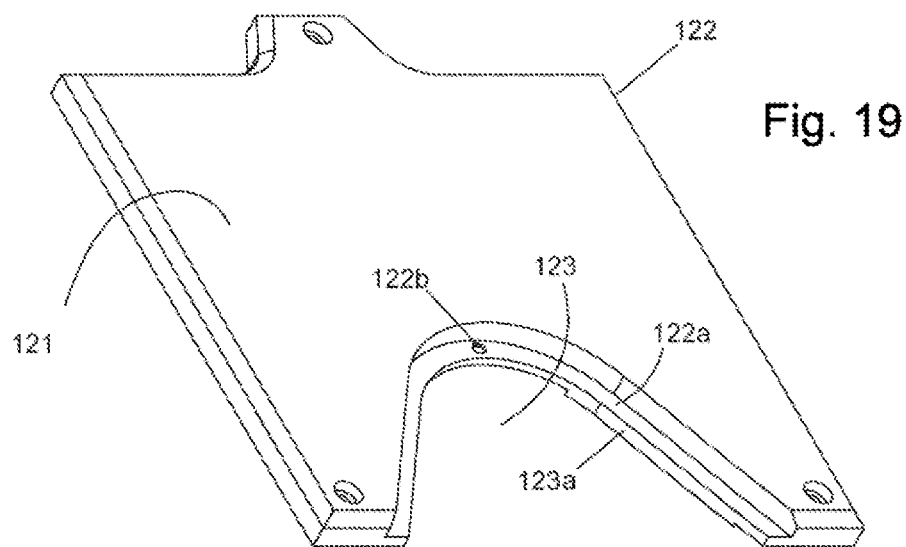
FIG. 19 is a top perspective view of the cover body of FIG. 6.
Figure 20:
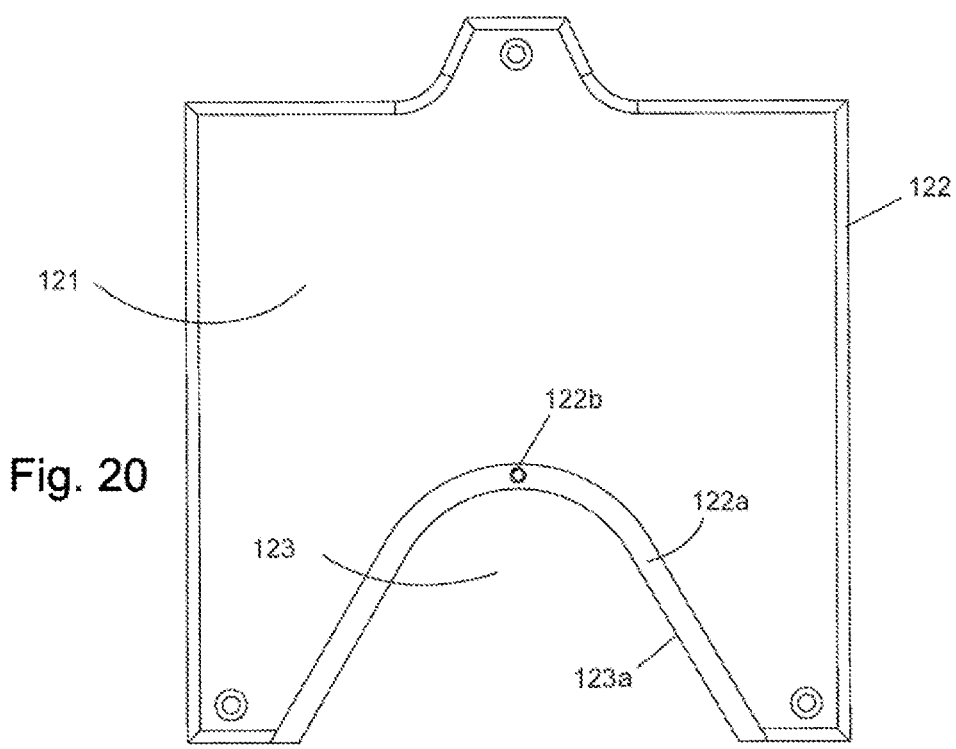
FIG. 20 is a top plan view of FIG. 19.

FIG. 19 is a perspective view of cover body 122. Cover body 122 has a top surface 121, a cover opening 123 and a cover opening edge 123a. Recessed from top surface 121 and along cover opening edge 123a is a cover body ledge 122a that coincides with ledge 166 of cover insert 150. It should be noted that a cover opening 122b also coincides with a cover insert opening 160a when cover insert 150 is assembled to cover body 122. A pin 161 (not shown) may be fixedly attached to one of the cover opening 122b or the cover insert opening 160a so that cover insert 150 may partially decouple from cover body 122 to allow vertical movement of cover insert 150 relative to cover body 122 and vice versa. As discussed earlier and in the alternative, the cover insert can be partially secured to the cover body 122 by means of a spring like element or elements, which can provide additional downward force to the cover insert, thus increasing force against the crucible. FIG. 20 is a top view of cover body 122.

Figure 21:
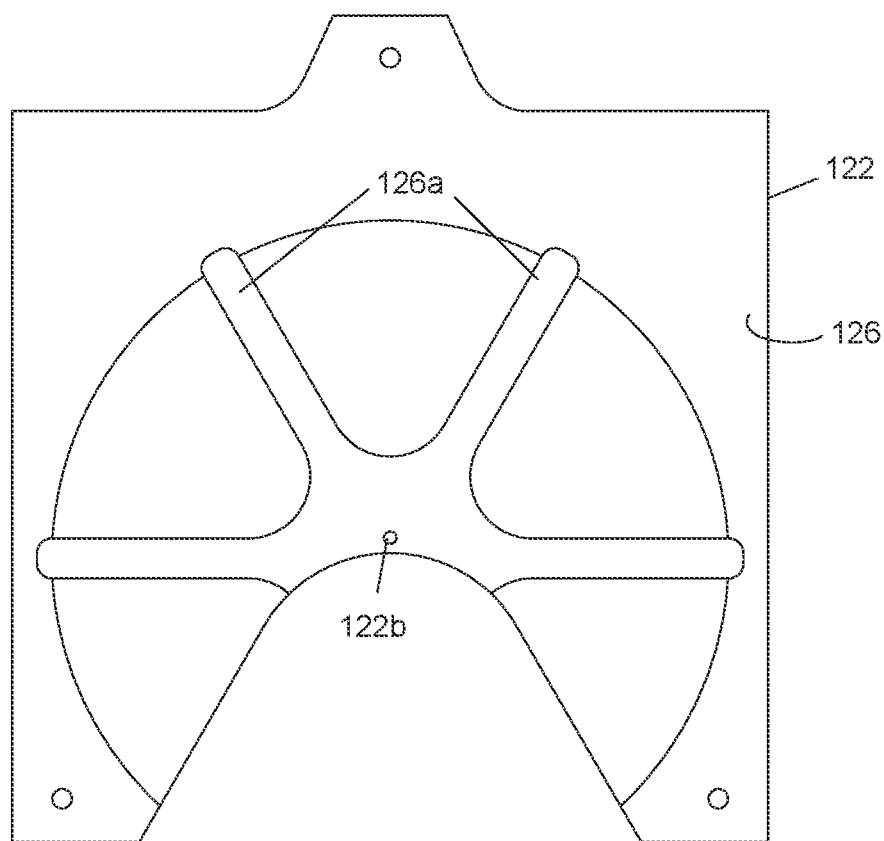
FIG. 21 is a bottom plan view of FIG. 19.
Figure 22:
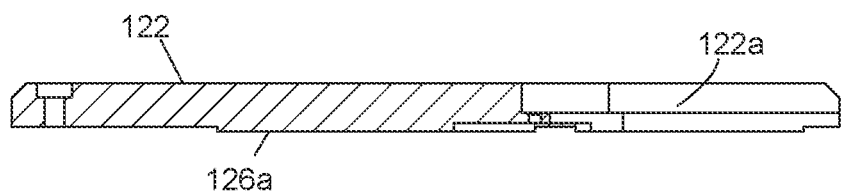
FIG. 22 is a right side plan view of FIG. 19.

FIG. 21 is a bottom view of cover body 122 showing structural features that are capable of mating contact with corresponding structural features of the crucible to further isolate each pocket from an adjacent pocket by contact between the covering surface and the crucible. This is similar to FIG. 8 but without the cover insert 150. As in FIG. 8, FIG. 21 shows cover body 122 with cover bottom surface 126 and bottom surface portions 126a that are raised away from cover bottom surface 126 a predefined distance and serve the function to interact with crucible 130 as previously disclosed. FIG. 22 is a side cross-sectional view of FIG. 21.

Figure 23:
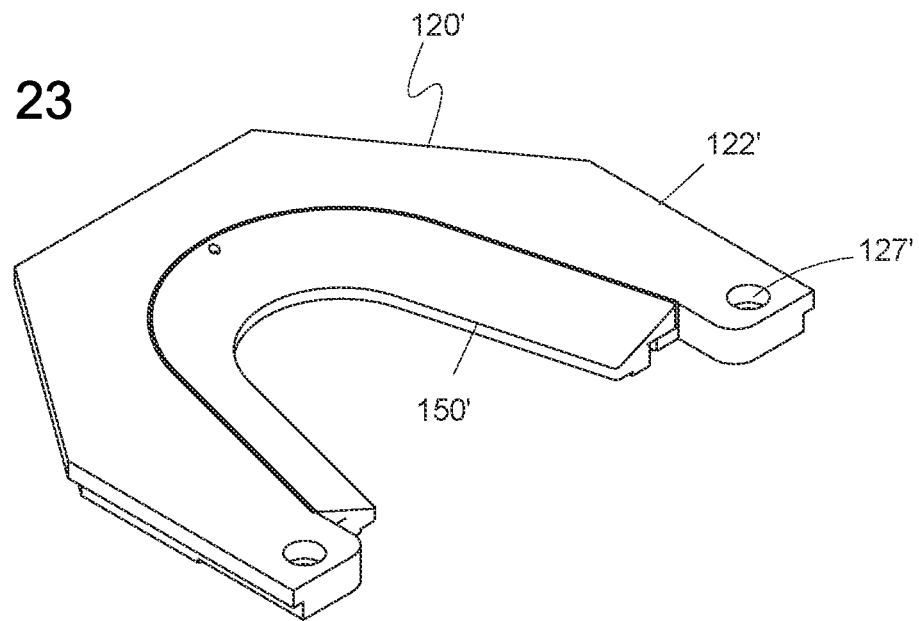
FIG. 23 is a right perspective view of a second embodiment of the invention showing a two-piece crucible cover with a cover body and a cover insert in an up position.
Figure 24:
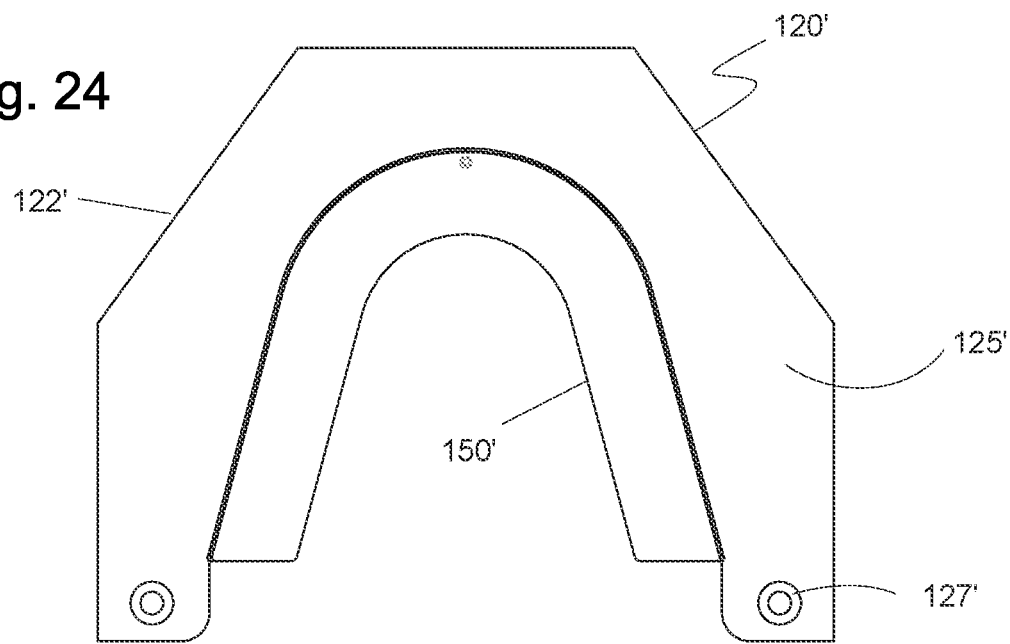
FIG. 24 is a top view of FIG. 23.

Turning now to FIG. 23, there is illustrated a second embodiment of the present invention showing cover 120'. Cover 120' has a cover insert 150' in down position relative to cover body 122'. This position is attained when the lifting mechanism 250 raises cover 120' away crucible 130. FIG. 24 is a top plan view of cover 120'. In both FIGS. 23 and 24, there is illustrated the connecting locations 127' to which rods 254 are connected for lifting of cover 120'. In this embodiment, cover insert 150' is recessed within the V-shape opening of cover 120' such that the ends of cover insert 150' do not align with the front end of cover 120'.

Figure 25:
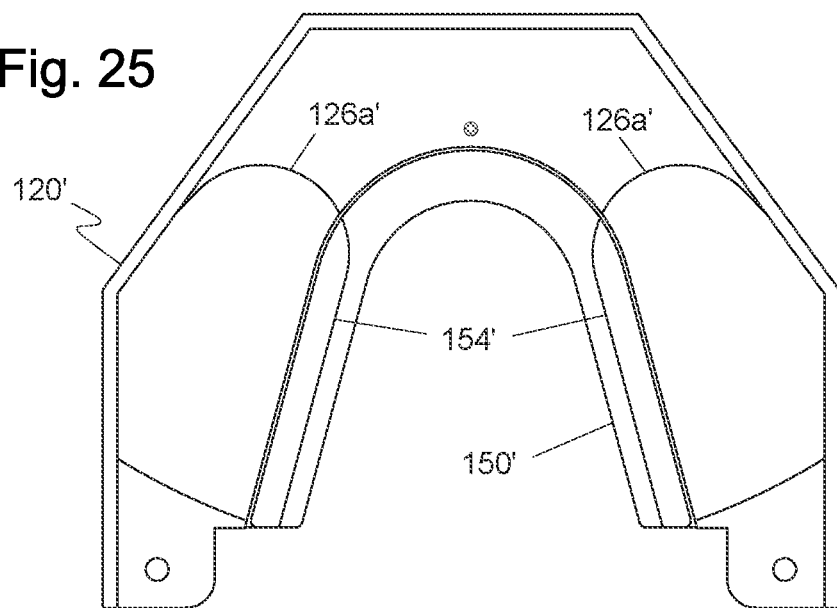
FIG. 25 is a bottom view of FIG. 23.
Figure 26:
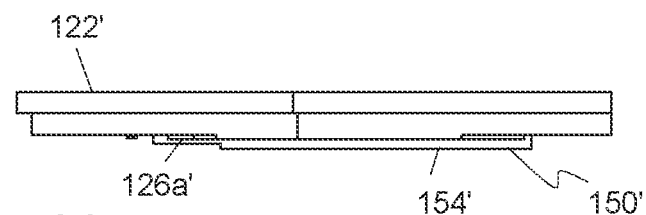
FIG. 26 is a right side plan view of FIG. 23.
Figure 27:
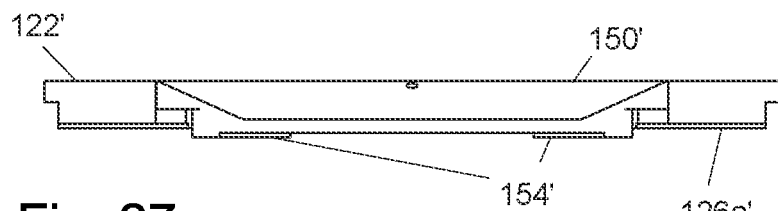
FIG. 27 is a front plan view of FIG. 23.

FIG. 25 is a bottom plan view of cover 120' of FIG. 23. Cover 120' has a bottom surface 126' and a plurality of bottom surfaces 126a' that interact with crucible surface portions 134a of crucible 130. Cover insert 150' also includes insert bottom surfaces 154' that interact with crucible surface portions 134a. FIG. 26 is a side plan view of FIG. 23 showing cover 120' with cover insert 150'. FIG. 27 is a front view of cover 120' shown in FIG. 23.

Figure 28:
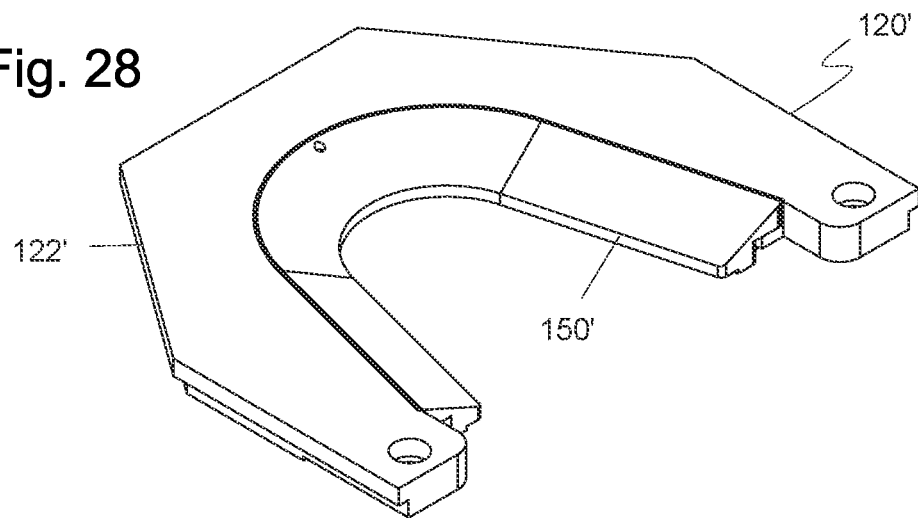
FIG. 28 is a right perspective view of the second embodiment of the invention showing the cover insert in a down position.
Figure 29:
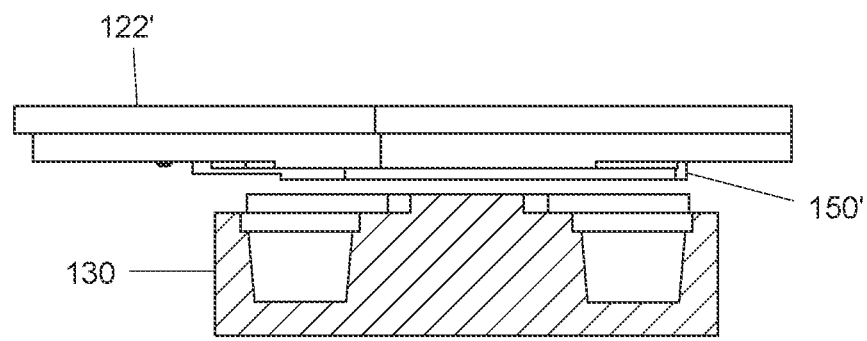
FIG. 29 is a right side plan view of FIG. 28 showing the cover in the up position relative to the crucible to allow crucible rotation.
Figure 30:
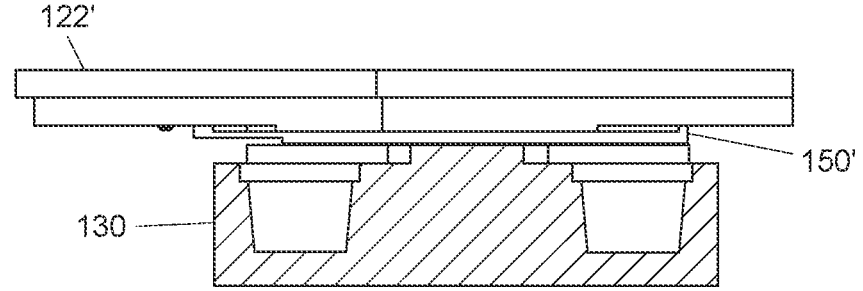
FIG. 30 is a right side, cross-sectional view of FIG. 28 showing the cover body and cover insert in a partially down position relative to the crucible with the cover body and cover insert still coupled where the cover insert is making initial contact with the crucible but the cover body is not in contact with the crucible.
Figure 31:
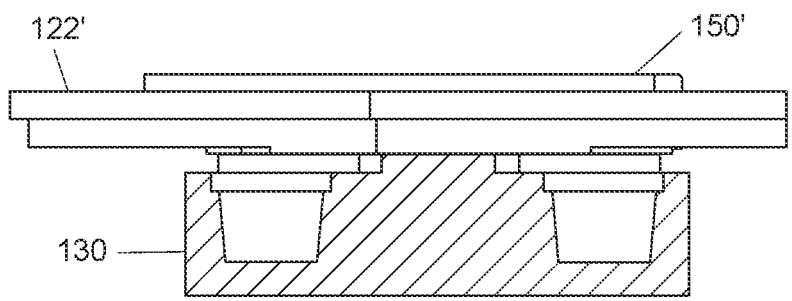
FIG. 31 is a right side, cross-sectional view of FIG. 28 showing the cover body decoupled from the cover insert where the cover body continues down to make contact with the copper coil housing and the cover insert remains in contact with the crucible.

FIG. 28 is a perspective view of cover 120' with cover insert 150' in a down position relative to cover body 122'. This position is attained when the lifting mechanism 250 lifts cover 120' away from crucible 130 to allow rotation of crucible 130. FIG. 29 is a side view of cover 120' in an up position relative to crucible 130. As shown, neither cover body 122 nor cover insert 150 contacts any portion of crucible 130. In this position, crucible 130 may be rotated to position one of the plurality of crucible pockets 132 to align with the cover opening 124'. FIG. 30 is a side view of cover 120' lowered toward crucible 130 where cover insert 150' just begins to make contact with crucible surface 134 or crucible surface portion 134a as the cover is being lowered by lifting mechanism 250. Lifting mechanism continues to lower cover 120' until cover bottom surface 126' or bottom surface portions 126a' contact with crucible surface 134 or crucible surface portion 134a. As can be seen between FIGS. 30 and 31, the movement of cover body 122' caused by cover body 122' being lowered to contact crucible surface 134 causes cover insert 150' to make contact with crucible surface 134 and stop its downward movement while cover body 122' continues its descent. FIGS. 30 and 31 show how cover insert 150' moves relative to cover body 122' such that cover insert 150' partially decouples from cover body 122' and seeks its own height and levelness when cover body 122' is lowered sufficiently.

Figure 32:
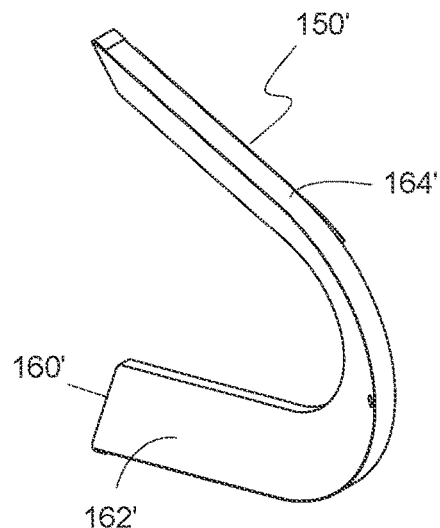
FIG. 32 is a top perspective view of the cover insert of FIG. 23.
Figure 33:
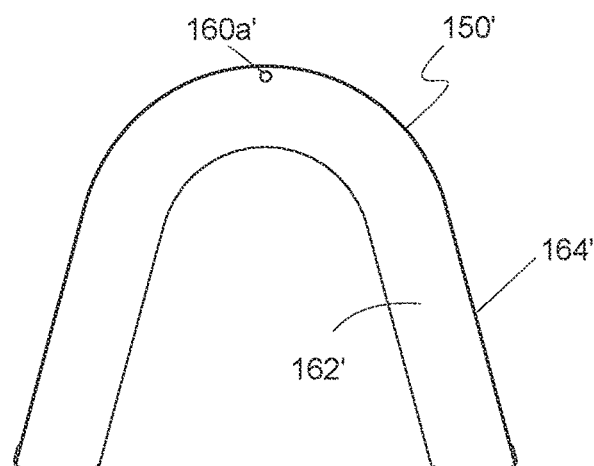
FIG. 33 is a top plan view of FIG. 32.
Figure 34:
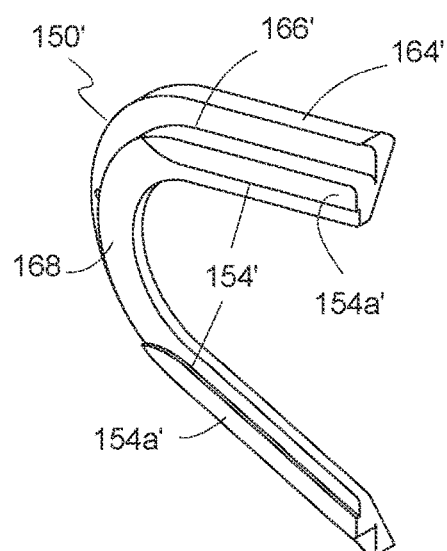
FIG. 34 is a bottom perspective view of the cover insert of FIG. 23.
Figure 35:
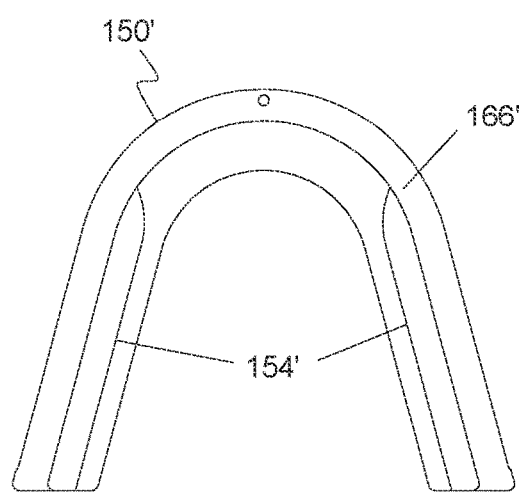
FIG. 35 is a bottom plan view of FIG. 34.

Turning now to FIGS. 32 to 35, there is illustrated various views of cover insert 150'. FIG. 32 is a top perspective view showing cover insert 150' having a V-shape with a tapered top surface 162' with an outside side surface 164'. FIG. 33 is a top view of cover insert 150'. FIG. 34 is a bottom perspective view of insert body 150'. Cover insert 150' has a bottom portion 168' that is recessed back away from outside side surface 164' forming a ledge 166'. Bottom portion 168' extends along the V-shape over the entire length of cover insert 150'. Bottom portion 168' further includes raised bottom portions 154' that extend along a portion of the arms of the V-shape to provide a bottom crucible contact surface 154a' that contacts crucible surface 134 or crucible surface portions 134a when cover 120' is lowered sufficiently to contact copper coil housing 113. FIG. 35 is a bottom view of cover insert 150'.

Figure 36:
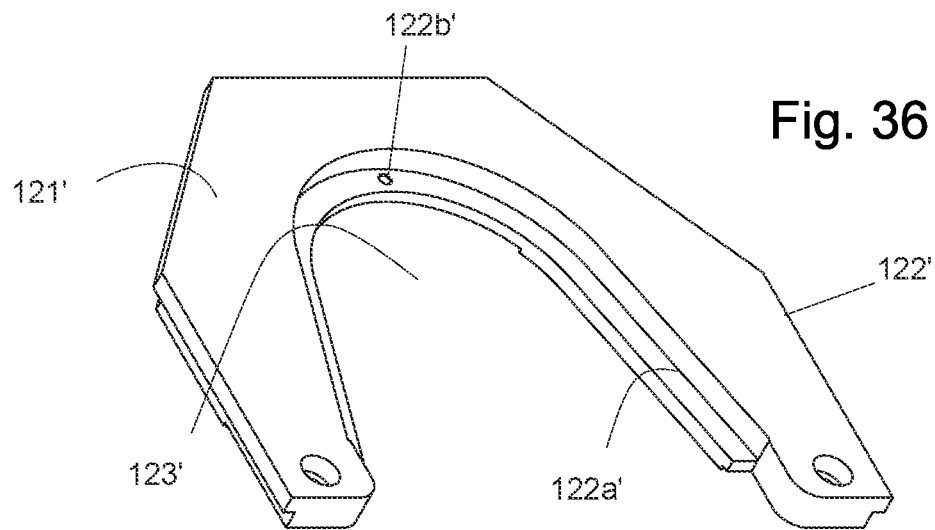
FIG. 36 is a top perspective view of the cover body of FIG. 23.
Figure 37:
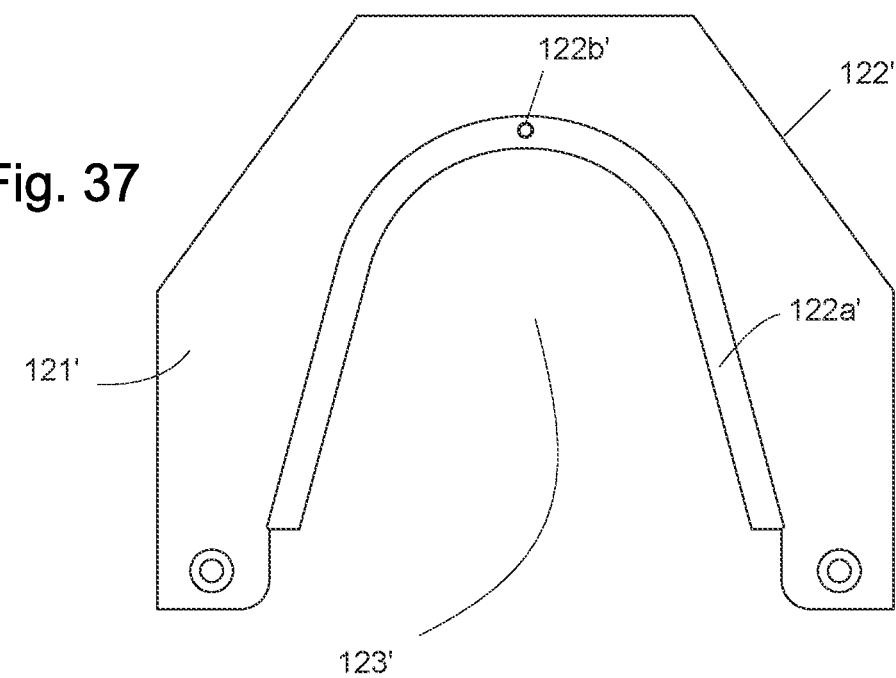
FIG. 37 is a top plan view of FIG. 36.

FIG. 36 is a perspective view of cover body 122'. Cover body 122' has a top surface 121' and a cover opening 123'. Recessed from top surface 121' and along cover opening 123' is a cover body ledge 122a' that coincides with ledge 166' of cover insert 150'. It should be noted that a cover opening 122b' also coincides with a cover insert opening 160a' when cover insert 150' is assembled to cover body 122'. A pin 161 (not shown) may be fixedly attached to one of the cover opening 122b' or the cover insert opening 160a' so that cover insert 150' may partially decouple from cover body 122' to allow vertical movement of cover insert 150' relative to cover body 122' and vice versa. As discussed earlier and in the alternative, the cover insert can be partially secured to the cover body 122' by means of a spring like element or elements, which can provide additional downward force to the cover insert, thus increasing force against the crucible. FIG. 37 is a top view of cover body 122'.

Figure 38:
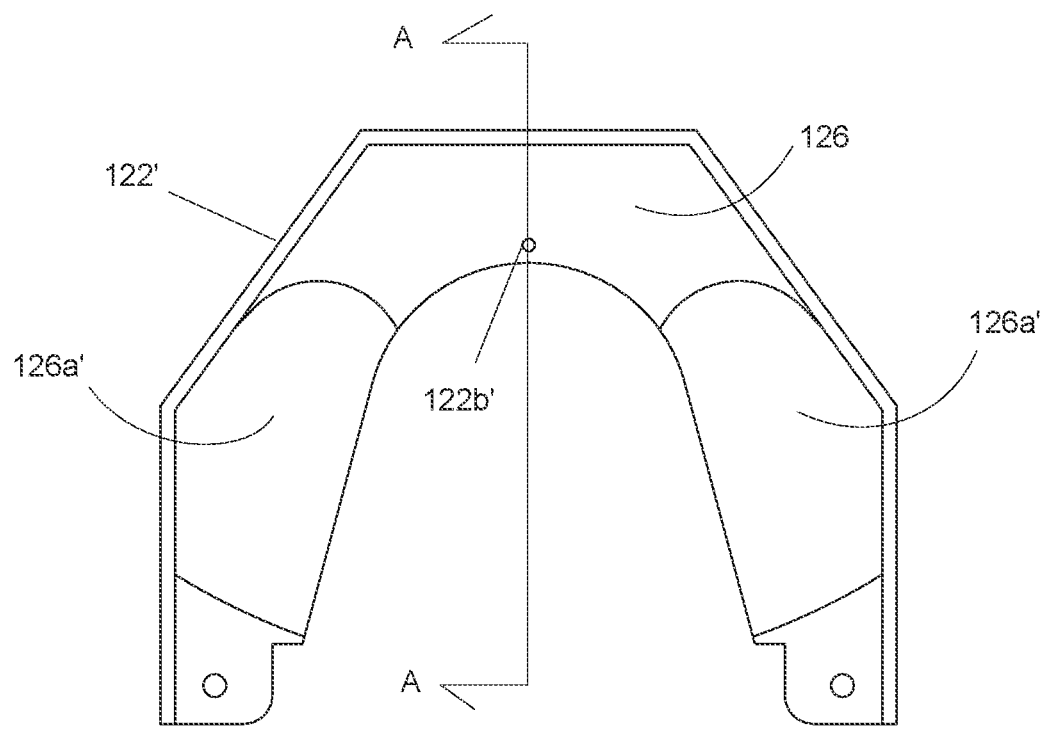
FIG. 38 is a bottom plan view of FIG. 36.
Figure 39:
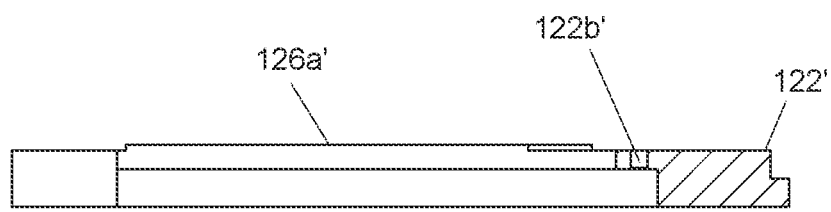
FIG. 39 is a right side plan view of FIG. 36.

FIG. 38 is a bottom view of cover body 122'. This is similar to FIG. 25 but without the cover insert 150'. As in FIG. 25, FIG. 38 shows cover body 122' with cover bottom surface 126' and bottom surface portions 126a' that are raised away from cover bottom surface 126' a predefined distance and serve the function to interact with crucible 130 as previously disclosed. FIG. 39 is a side cross-sectional view of FIG. 38 taken along line A-A.

Figure 40:
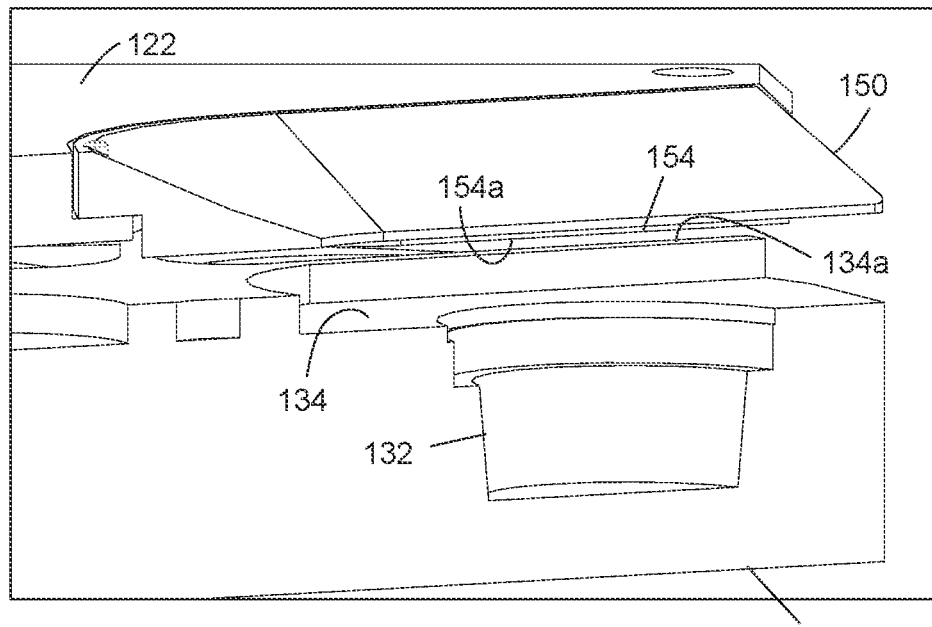
FIG. 40 is a perspective view of the heated pocket of the invention with the cover in the up position above the crucible.
Figure 41:
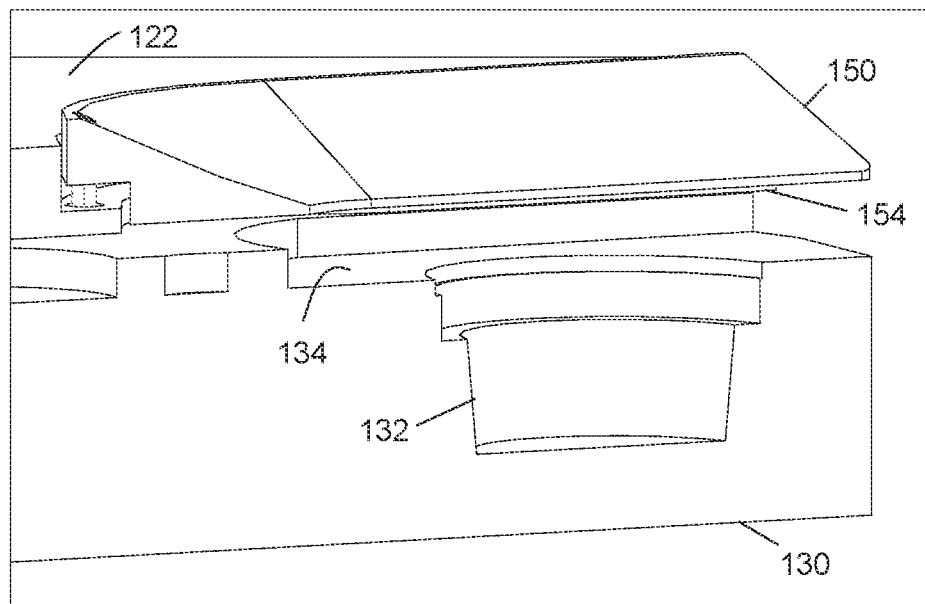
FIG. 41 is a perspective view of the heated pocket of the invention with the cover in the down position with the cover insert contacting the crucible.

Greater detail near the heated pocket of one embodiment is shown in FIG. 40. Pocket edge 133 shown in FIG. 40 contains the heating position 135, and thus pocket 132 shown in FIG. 40 is the heated pocket. FIG. 40 shows the source configured for coating, with cover 120 in the "up" position, in which cover body 122 and cover insert 150 are retracted from contact with crucible surface portion 134a, permitting rotation of crucible 130. FIG. 41 shows the cover "down" position. In the down position, cover insert 150 has bottom crucible contact surface 154a in contact with crucible surface portion 134a. The contact barrier thus formed extends along pocket 132 far enough to provide a contact barrier between the heated and unheated pockets. To reduce the need to service the cover by removing deposit material, the cover insert 150 can be replaced with a new cover insert 150, which also can partially decouple from cover body 122.

In this invention, the cover and crucible contact arrangement blocks contaminants from propagating from heated to unheated pockets by eliminating the line-of-sight movement of coating vapors. Due to the low pressure, vapors travel nearly unimpeded until they strike one of the surfaces within system 100. Upon impact, a substantial amount of incident vapor molecules will stick to the surface, resulting in an accumulating deposit. By incorporating a partially decoupling cover insert 150 in cover 120 along with contact surfaces between cover body 122 and crucible surface 134, deposits can accumulate over some period of time on the cover insert 150 without presenting a source for cross-contamination. Further, where the raised bottom portions 154 are set back from tapered edge 163 of cover insert 150, the clearance between bottom portion 168 of tapered edge 163 and crucible 130 allows for deposits to accumulate on those surfaces without decreasing the ability of the raised bottom portions 154 to block contaminants, or to allow deposits to easily flake or rub off and contaminate other pockets. Also, some materials of interest, such as gold, weld when surfaces having deposits of those materials are brought into contact. Thus, surfaces having deposits of materials that contact weld can, under the conditions present in a high vacuum chamber, weld when brought into contact. Welding results in either binding mechanisms within the system or dislodging relatively large flakes of deposit if movement occurs. Welding is prevented in the present invention by preventing contact of surfaces of tapered edge 163 and bottom portion 168 and by providing regions for deposits that are away from possible contact points.

Figure 42:
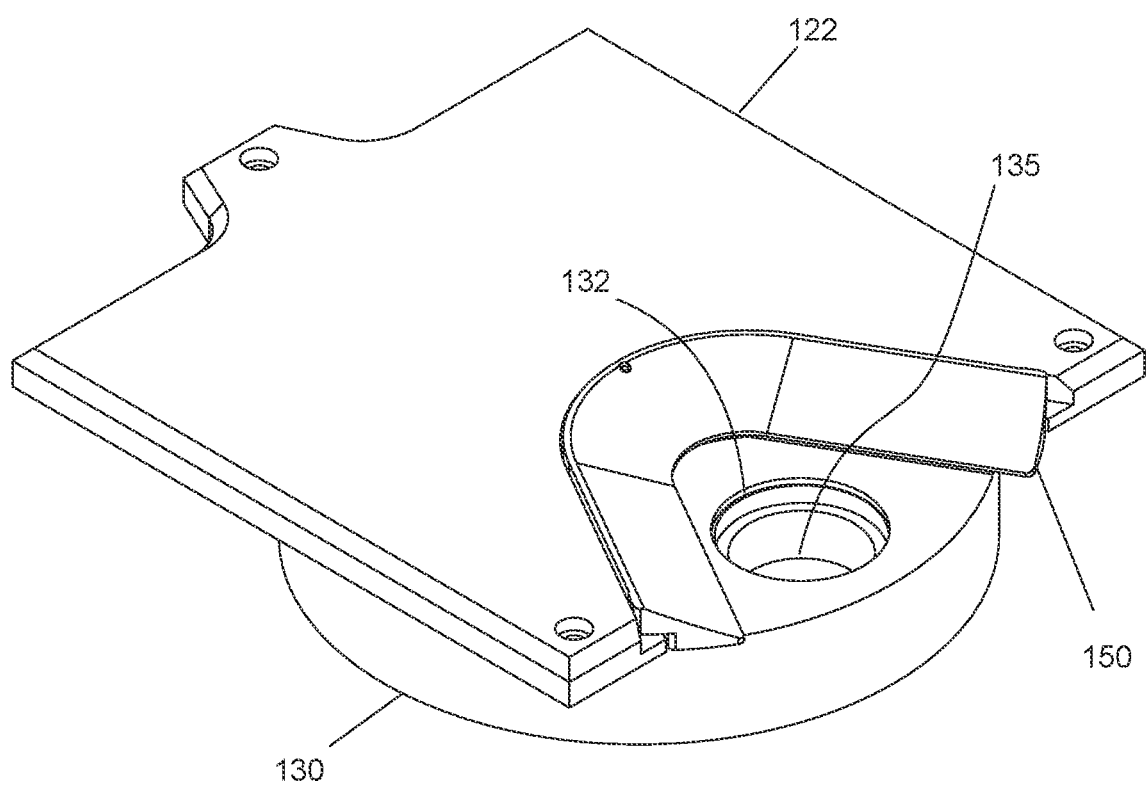
FIG. 42 is a perspective view of the first embodiment of the invention showing the cover and crucible.

The manner in which cover body 122 contacts with the crucible in the first embodiment will now be explained. Crucible 130 has a plurality of pockets 132, each of which has a crucible surface portion 134a extending away from crucible 130. Insert bottom contact surface 154a is adapted to have approximately the same contour as crucible surface portion 134a, as is best seen in FIG. 42. When cover 120 is aligned with crucible 130 as in FIG. 42, one of pockets 132 is uncovered, with tapered edge 163 closest to the uncovered pocket. As with the first embodiment, the edge of uncovered pocket corresponds to the heating location 135, and thus the uncovered pocket is the heated pocket. Extending away from cover 120 towards crucible 130 are bottom surface portions 126a that contact other crucible surface portions 134a.

Operation of the Invention

When selecting between the multiple pockets, the relative motion between crucible and cover should proceed in a manner that does not allow for the crucible and cover to contact. From the described cooperation of the cover and crucible to form a contact barrier of the present invention, it would be obvious to one skilled in the art that crucible selection motion and cover motion must be controlled to provide the stated advantages. Thus, contact between the cover insert 150, 150', or between any parts which have accumulated deposits should be minimized during pocket selection. Many mechanisms and control systems could be configured to achieve those advantages, and the descriptions and embodiments provided here are illustrative and are not meant to limit the scope of the present invention.

For the rotatable pocket configuration of the present invention, the cover and crucible form two halves of a contact barrier that would impede rotation of the crucible 130. Both illustrated embodiments of the invention, thus, includes a rotation mechanism (not shown) for rotating crucible 130 to select from among multiple pockets 132, and a lifting mechanism 250 to allow rotation without contact of cover 120 and crucible 130. The rotation mechanisms couples crucible 130 to source housing 112, and can be controlled by external devices not shown to rotate crucible 130 about axis of rotation 235. By controlling the rotational position of crucible 130, any of pockets 132 can be brought into heating location 135. The rotation mechanism can consist of AC or DC motors or rotary or linear pneumatic actuators, and may also include sensors mounted on crucible and housing to detect rotational position. FIG. 4 shows a bottom perspective view of the lifting mechanism 250, including an actuator 252 and rods 254 that provide lifting motion to the cover 120 (not shown). Also shown is crucible 130 and electron beam source exit 140. In one embodiment actuator 252 is a single action pneumatic actuator with a spring return enclosed in a bellows, with the spring forcing the cover into a normally up position. In another embodiment, actuator 252 is double acting, providing both raising and lower operations. Other lifting mechanism that could be used with this invention include, but are not limited to, lead screws, piezo-electric actuators, bimetallic elements, magnetic solenoid, and linear motors.

The motion involved in lifting the cover is shown more clearly in the side view of FIG. 5. The solid and dashed cover lifting components (actuator 252, rods 254 and cover 120) shows the extreme points of motion. Cover 120 is connected at its corners through rods 254 to actuator 252. In the normally up, dashed position, bottom surface 152 of cover insert 150 clears the obstructing crucible, and in the forced down, solid position, the cover 120 is fully engaged. The combination of a rotational and lifting mechanism is generally useful for rotational crucibles providing a way of covering and uncovering multiple pockets.

Although the preferred embodiments of the present invention have been described herein, the above description is merely illustrative. Further modification of the invention herein disclosed will occur to those skilled in the respective arts and all such modifications are deemed to be within the scope of the invention as defined by the appended claims.

What is claimed is:

1. A crucible cover for a multiple pocket vapor source that produces vapor by an electron beam directed to uncovered crucible pockets, the crucible cover comprising:
   a cover body having a covering surface, a cover opening, and a cover opening edge along the cover opening, the covering surface facing a crucible having a crucible surface with a plurality of pockets formed therein for holding coating materials to be evaporated, wherein the pockets are covered or uncovered by automatically lifting the crucible cover, rotating the crucible, and lowering the crucible cover to thereby align one of the plurality of pockets with the cover opening; and
   a cover insert having an insert bottom surface and an open area that coincides with the cover opening, wherein the cover insert is removably coupled to the cover body, wherein the insert bottom surface extends below the covering surface, wherein the cover insert is connected along the cover opening edge, wherein the cover insert becomes partially decoupled from the cover body when the cover body is lowered relative to the crucible and the cover insert contacts a crucible barrier of the crucible, the crucible barrier extending from a perimeter of the crucible pockets towards the cover insert.

2. The crucible cover of claim 1 wherein the cover insert has structural features isolating each pocket from an adjacent pocket by contact between the cover insert and the crucible including isolating the uncovered pocket from the covered pockets.

3. The crucible cover of claim 1 wherein the cover insert has an insert body that is V-shaped with an inside edge, an outside edge and a top surface.

4. The crucible cover of claim 3 wherein the top surface is tapered in thickness from the outside edge to the inside edge.

5. The crucible cover of claim 1 wherein the insert bottom surface of the cover insert has raised bottom portions having an insert bottom contact surface wherein the insert bottom contact surface is recessed a predefined distance from the inside edge.

6. The crucible cover of claim 1 wherein the insert bottom surface of the cover insert is recessed back away from the outside surface forming a ledge.

7. The crucible cover of claim 1 wherein the cover opening has a recess along the cover opening edge forming a cover body ledge that coincides with the cover insert ledge to matingly couple and partially decouple with the cover insert.

8. The crucible cover of claim 1 wherein the covering surface of the cover body has structural features that are capable of mating contact with corresponding structural features of the crucible further isolating each pocket from an adjacent pocket by contact between the covering surface and the crucible including isolating the uncovered pocket from the covered pockets.

9. A covered, multiple pocket vapor source assembly, wherein vapor is produced by an electron beam that can be directed to uncovered crucible pockets, the assembly comprising:
   a housing;
   a crucible rotatably mounted within the housing, the crucible having a surface;
   a plurality of pockets in the crucible, the pockets configured to hold coating materials, and the crucible rotatable to bring any of the pockets into a position to receive energy from the electron beam;
   a cover having a cover body with a covering surface and a cover opening, wherein the covering surface faces the crucible, and a cover insert having an insert bottom surface and an open area that coincides with the cover opening, wherein the cover insert is removably coupled to the cover body within the cover opening, wherein the insert bottom surface extends below the covering surface bottom, wherein the cover insert becomes partially decoupled from the cover body when the cover body is lowered relative to the crucible and the cover insert contacts a crucible barrier of the crucible, the crucible barrier extending from a perimeter of the crucible pockets towards the cover insert; and
   matching pairs of cooperating surfaces on the cover insert and the crucible surface between each pocket.

10. The assembly of claim 9 wherein the cover insert has structural features isolating each pocket from an adjacent pocket by contact between the cover insert and the crucible including isolating the uncovered pocket from the covered pockets.

11. The assembly of claim 9 wherein the cover insert has an insert body that is V-shaped with an inside edge, an outside edge and a top surface.

12. The assembly of claim 11 wherein the top surface is tapered in thickness from the outside edge to the inside edge.

13. The assembly of claim 9 wherein the insert bottom surface of the cover insert has raised bottom portions having an insert bottom contact surface wherein the insert bottom contact surface is recessed a predefined distance from the inside edge.

14. The assembly of claim 9 wherein the insert bottom surface of the cover insert is recessed back away from the outside surface forming a ledge.

15. The assembly of claim 9 wherein the cover opening has a recess along a cover opening edge forming a cover body ledge that coincides with the cover insert ledge to matingly couple and partially decouple with the cover insert.

16. The assembly of claim 9 wherein the covering surface of the cover body has structural features that are capable of mating contact with corresponding structural features of the crucible further isolating each pocket from an adjacent pocket by contact between the covering surface and the crucible including isolating the uncovered pocket from the covered pockets.

17. A crucible covering system for a multiple pocket source, the crucible covering system comprising:
   a crucible having an axis and a plurality of pockets to hold material to be evaporated, wherein the crucible has a crucible surface between each pocket; and
   a cover that extends along a plane perpendicular to the axis to cover all but a selected at least one of the plurality of pockets, the cover having a cover body with a cover opening to expose one pocket of the plurality of pockets, the cover body having a cover insert with an insert bottom surface and an open area that coincides with the cover opening, wherein the cover insert is removably coupled to the cover body along a cover opening edge, wherein the insert bottom surface extends below the covering surface, wherein the cover insert becomes partially decoupled from the cover body when the cover body is lowered relative to the crucible and the cover insert contacts a crucible barrier of the crucible, the crucible barrier extending from a perimeter of the crucible pockets towards the cover insert; and
   matching pairs of cooperating surfaces on the cover insert and the crucible surface between each pocket.

18. The crucible covering system of claim 17 wherein the cover insert has an insert body that is V-shaped with an inside edge, an outside edge and a top surface.

19. The crucible covering system of claim 18 wherein the top surface is tapered in thickness from the outside edge to the inside edge.

20. The crucible covering system of claim 17 wherein the insert bottom surface of the cover insert has raised bottom portions having an insert bottom contact surface wherein the insert bottom contact surface is recessed a predefined distance from the inside edge.

21. The crucible covering system of claim 17 wherein the insert bottom surface of the cover insert is recessed back away from the outside surface forming a ledge.

22. The crucible covering system of claim 17 wherein the cover opening has a recess along a cover opening edge forming a cover body ledge that coincides with the cover insert ledge to matingly couple and partially decouple with the cover insert.

23. The crucible covering system of claim 17 wherein the covering surface of the cover body has structural features that are capable of mating contact with corresponding structural features of the crucible further isolating each pocket from an adjacent pocket by contact between the covering surface and the crucible including isolating the uncovered pocket from the covered pockets.

\* \* \* \* \*